United States Patent
Hong

(10) Patent No.: US 10,607,128 B1
(45) Date of Patent: Mar. 31, 2020

(54) NEAR-FIELD COMMUNICATION DATA CARRIER INSTALLED ON METAL OBJECT

(71) Applicant: YOKE INDUSTRIAL CORP., Taichung (TW)

(72) Inventor: Rong-Der Hong, Taichung (TW)

(73) Assignee: YOKE INDUSTRIAL CORP., Taichung (TW)

( * ) Notice: Subject to any disclaimer, the term of this patent is extended or adjusted under 35 U.S.C. 154(b) by 0 days.

(21) Appl. No.: 16/194,077

(22) Filed: Nov. 16, 2018

(30) Foreign Application Priority Data

Sep. 18, 2018 (TW) .............................. 107212714 U

(51) Int. Cl.
*G06K 19/07* (2006.01)
*H01F 27/24* (2006.01)
*H01F 27/28* (2006.01)
*H05K 1/18* (2006.01)

(52) U.S. Cl.
CPC ......... *G06K 19/0723* (2013.01); *H01F 27/24* (2013.01); *H01F 27/28* (2013.01); *H05K 1/181* (2013.01); *H05K 2201/1003* (2013.01); *H05K 2201/10424* (2013.01); *H05K 2201/10545* (2013.01)

(58) Field of Classification Search
CPC .............. G06K 19/0723; H05K 1/181; H05K 2201/1003; H05K 2201/10424; H05K 2201/10545; H01F 27/24; H01F 27/28
See application file for complete search history.

(56) References Cited

U.S. PATENT DOCUMENTS

| 9,847,578 B2 * | 12/2017 | Nakano ................. H01Q 1/243 |
| 2005/0179552 A1 | 8/2005 | Shoji et al. |
| 2007/0024516 A1 | 2/2007 | Araki et al. |
| 2016/0156104 A1 | 6/2016 | Nakano et al. |

OTHER PUBLICATIONS

Extended European Search Report for EP18206931.0, dated Jun. 13, 2019, Total of 6 pages.

* cited by examiner

*Primary Examiner* — Sonji N Johnson
(74) *Attorney, Agent, or Firm* — R. Lynette Wylie; Apex Juris, pllc.

(57) ABSTRACT

A near-field communication data carrier is adapted to be mounted in a metal object including a housing, an electronic assembly. The electronic assembly is disposed in the housing and includes a circuit board, a near-field communication chip, and a coil set. The circuit board has a first side and a second side, which are back to each other. The near-field communication chip is disposed on the first side. The coil set is disposed on the second side. The coil set includes a magnetic core and a coil. The coil is wound around the magnetic core and is electrically connected to the near-field communication chip.

13 Claims, 33 Drawing Sheets

NEAR-FIELD COMMUNICATION DATA CARRIER INSTALLED ON METAL OBJECT

BACKGROUND OF THE INVENTION

1. Technical Field

The present invention relates to an induction data carrier and, more particularly, to a near-field communication data carrier mounted in a metal object.

2. Description of Related Art

With the rise of smart manufacturing, intelligentization has gradually replaced automation, and the industry has gradually applied induction data carriers to various products to confirm the specifications or safety of products. Most of the induction data carriers used today use RFID data carriers (or RFID tags), in which the type, size, mechanical properties, manufacturer, date of manufacture, working load limit, service life, maintenance history, safety verification data, etc. of the corresponding object, or a link to a database that stores the corresponding data can be stored. A user has to manipulate an RFID reader to write the data in RFID data carrier or read the data out of it. However, the cost of the RFID reader is high, and if each employee needs an RFID reader, it would be a heavy burden to the employer.

Hence, the design of induction data carrier has gradually turned to the NFC data carrier that can be read by a device like a smartphone. However, most of the products, to which the data carriers are applied, are made of metal, and when the NFC data carrier is applied to a metal object, the data transmission and the induction efficiency of the NFC data carrier would be interfered by the surrounding metal material, so that the efficiency of transmission and induction decreases. For example, when the user applies the NFC data carrier to the products mainly made of metal, such as a connecting ring, a shackle, a pull ring, a rope socket, a snatch block, a hoist ring, a swivel, a swivel hoist ring, an eye bolt, a bearing swivels, a hook, a buckle, a carabiner, a double hook belt, a chain, a ratchet, a rope brake, a fall arrester, a snap hook, a hoist, etc., and if the data transmission and the reading efficiency of the NFC data carrier is low, it would cause problem for the user in application and decrease the working efficiency. In view of the above, designing the NFC data carrier, which could be read even it is mounted in the metal object, is one of the topics that the applicant works and studies hard.

BRIEF SUMMARY OF THE INVENTION

In view of the above, the purpose of the present invention is to provide a near-field communication data carrier, which still has a good efficiency of data transmission and data reading even when being mounted in a metal object.

The present disclosure provides a near-field communication data carrier adapted to be mounted in a metal object having a receiving portion. The near-field communication data carrier includes a housing and an electronic assembly. The housing is mounted in the receiving portion, and the maximum diameter of the housing is not more than 10 mm, while the maximum height of the housing is not more than 10 mm. The electronic assembly is provided in the housing and includes a circuit board, a near-field communication chip, and a coil set. The circuit board has a first side and a second side opposite to the first side. The near-field communication chip is provided on the first side of the circuit board. The coil set is provided on the second side of the circuit board and includes a magnetic core and a coil. The coil is wound around the magnetic core and is electrically connected to the near-field communication chip.

The advantage of the present invention is that with the aforementioned design, the near-field communication data carrier could sense external wireless signal through the coil set and could produce conductive current to drive the near-field communication chip to send a wireless signal.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
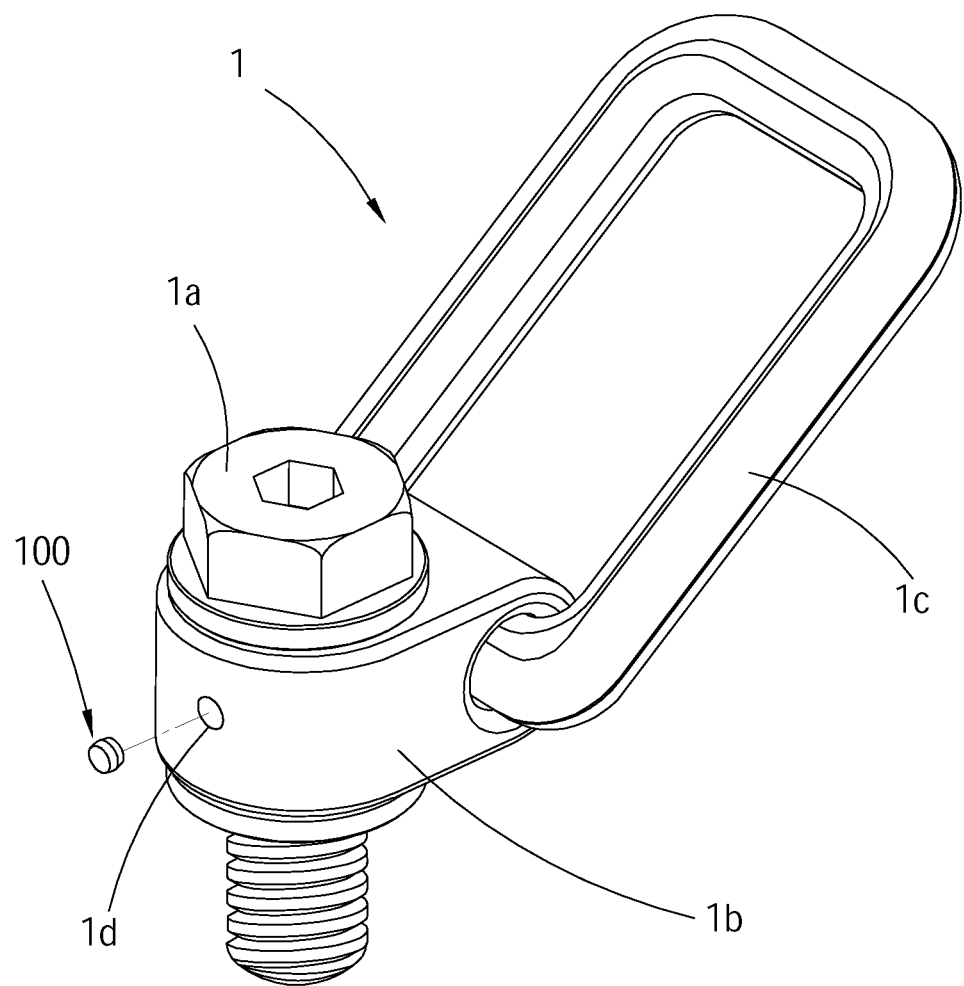
FIG. 1 is a perspective view showing the near-field communication data carrier and the metal object of an embodiment according to the present invention.
Figure 2:
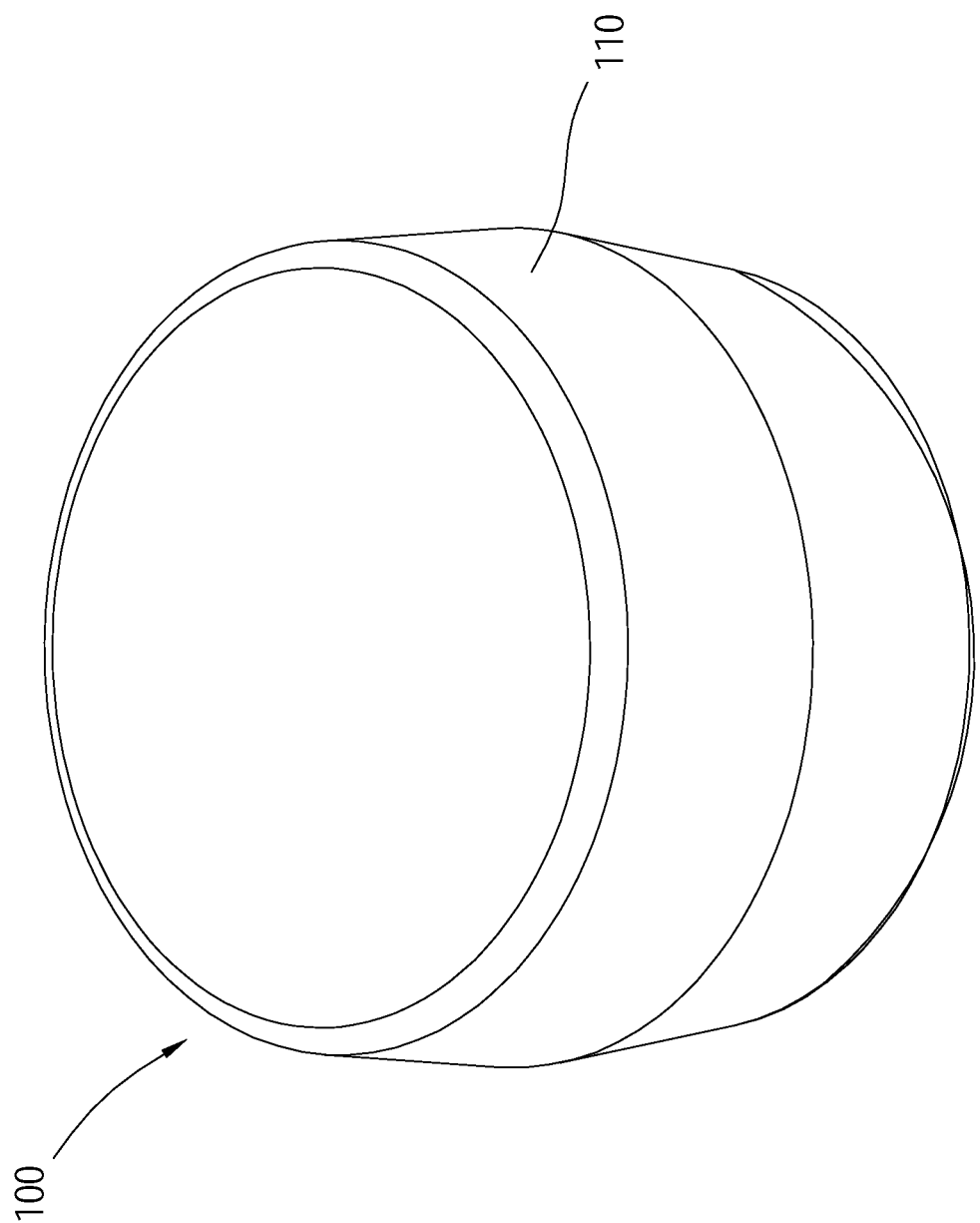
FIG. 2 is a perspective view showing the near-field communication data carrier of the embodiment shown in FIG. 1.
Figure 3:
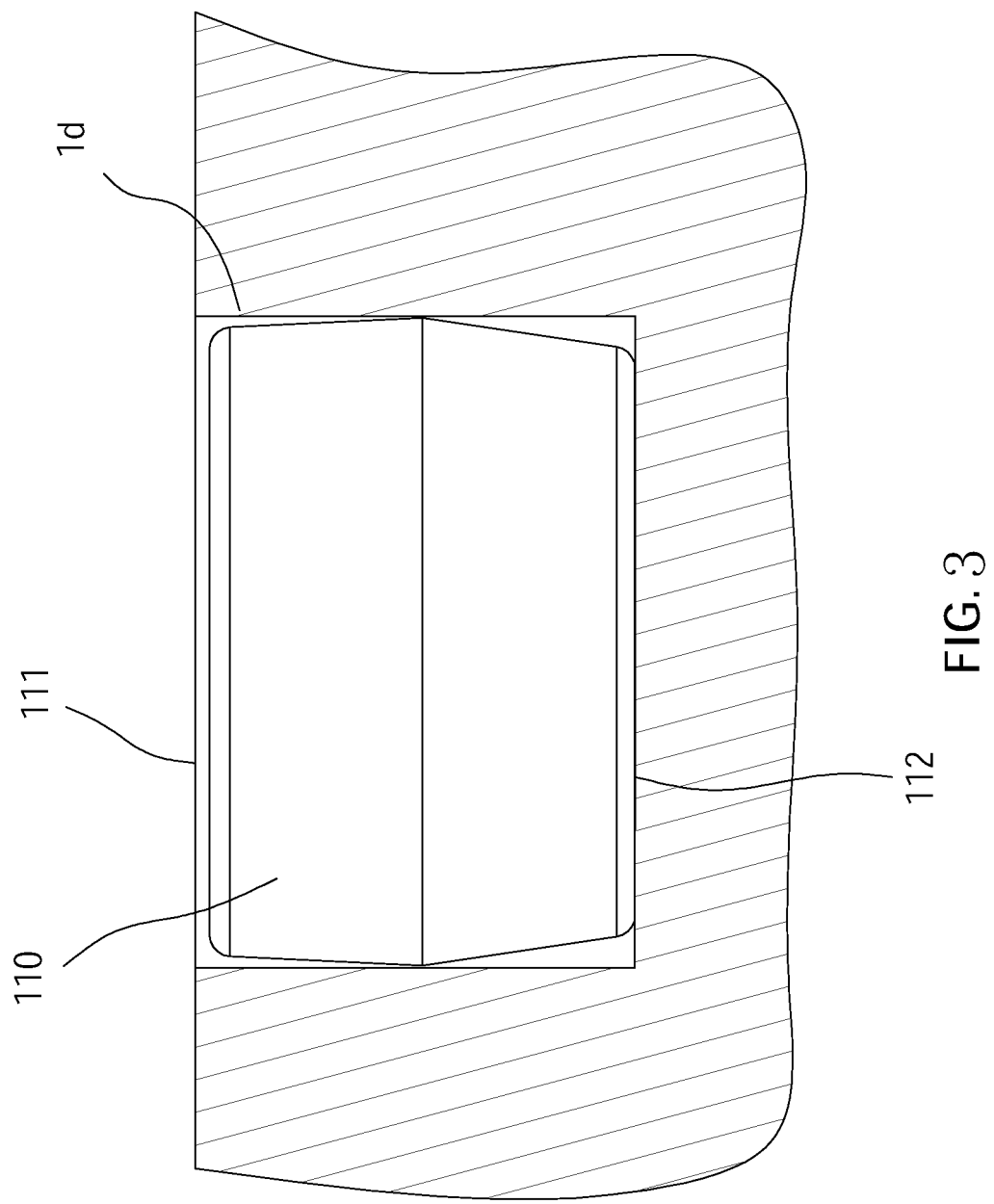
FIG. 3 is a cross-sectional view showing the near-field communication data carrier in the receiving portion of the embodiment shown in FIG. 1.

One embodiment of a near-field communication data carrier of the present invention will be explained clearly with reference to the drawings thereafter. As shown in FIG. 1 to FIG. 8, the near-field communication data carrier 100 is provided in a receiving portion of a metal object. In the present embodiment, the metal object is a side pull ring 1 for example. The side pull ring 1 includes a bolt 1*a*, a connecting member 1*b*, a hanging ring 1*c*, and a receiving portion. The bolt 1*a* is engaged with the connecting member 1*b*. The hanging ring 1*c* is pivotally joined to the connecting member 1*b*. The receiving portion is provided at a side of the connecting member 1*b*, wherein a blind hole 1*d* is taken as an example of the receiving portion.

The near-field communication data carrier 100 includes a housing 110 and an electronic assembly 120. The housing 110 is adapted to be mounted, embedded or tucked into the blind hole 1*d*. The maximum width of the housing 110 is not more than 10 mm, and the maximum height thereof is not more than 10 mm, either. In the present embodiment, the housing 110 is made of a plastic material. The housing 110 has a first end 111 and an opposite second end 112. The second end 112 is oriented to the blind hole 1*d* when the housing 110 is tucked into the blind hole 1*d*. Moreover, in the present embodiment, the housing 110 is designed to have a cylinder shape. The diameter of the housing 110 is about 6 mm and the height thereof is about 4 mm. The width of the housing 110 is expanded gradually from both the first end 111 and the second end 112 to a center, thereby facilitating the housing 110 to be fixed firmly in the blind hole 1d. The size design of the housing 110 could not only have an efficacy of facilitating miniaturization, but also have an advantage of not affecting or significantly affecting the structural strength of the metal object. Simultaneously, the housing 110 still has enough volume for the electronic assembly 120 and provides a good protection for the electronic assembly 120. Preferably, in an embodiment, the housing 110 is mainly made of a plastic material and a magnetically permeable material (or referred as a magnetic material) or the ingredient of the housing 110 could include a magnetic plastic or a plastic magnetic. For instance, the housing 110 could be made of a plastic material containing magnetic powder, wherein the plastic material could be, but is not limited to, nylon, engineering plastics or other polymer plastics. The magnetic powder could use, but is not limited to, ferrite, neodymium iron boron, samarium cobalt, or samarium iron nitride, etc. to improve the magnetic conductivity of the housing 110.

Figure 4:
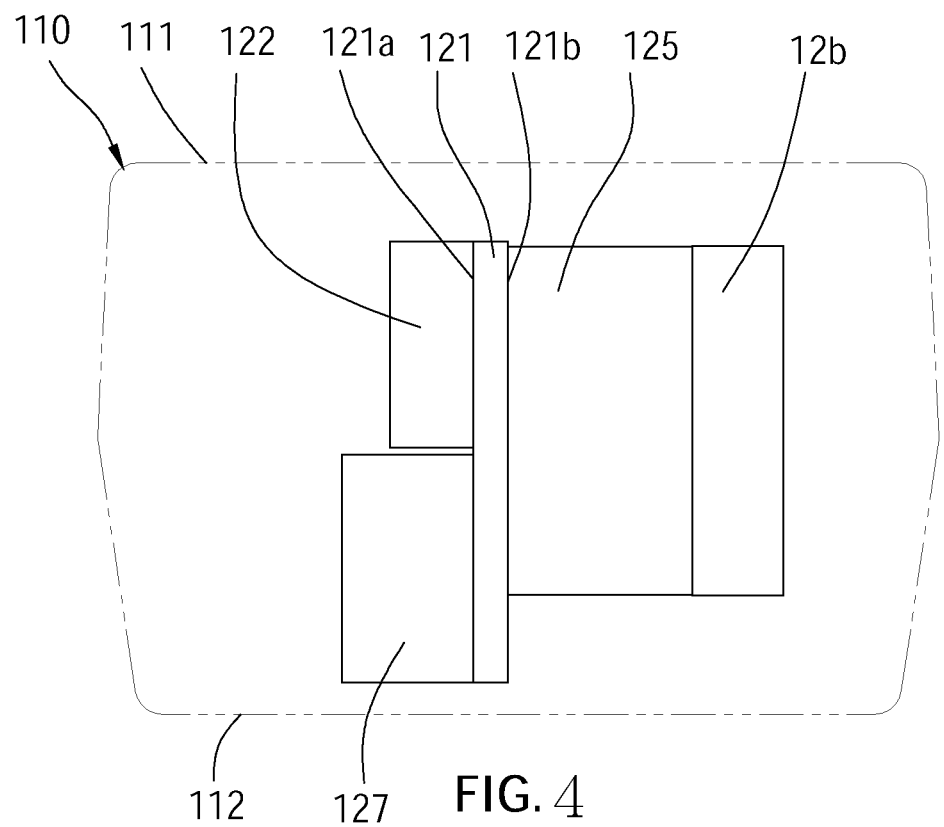
FIGS. 4 to 5 are cross-sectional views showing the near-field communication data carriers used in the embodiment shown in FIG. 1, disclosing the positions of the electronic assembly.
Figure 5:
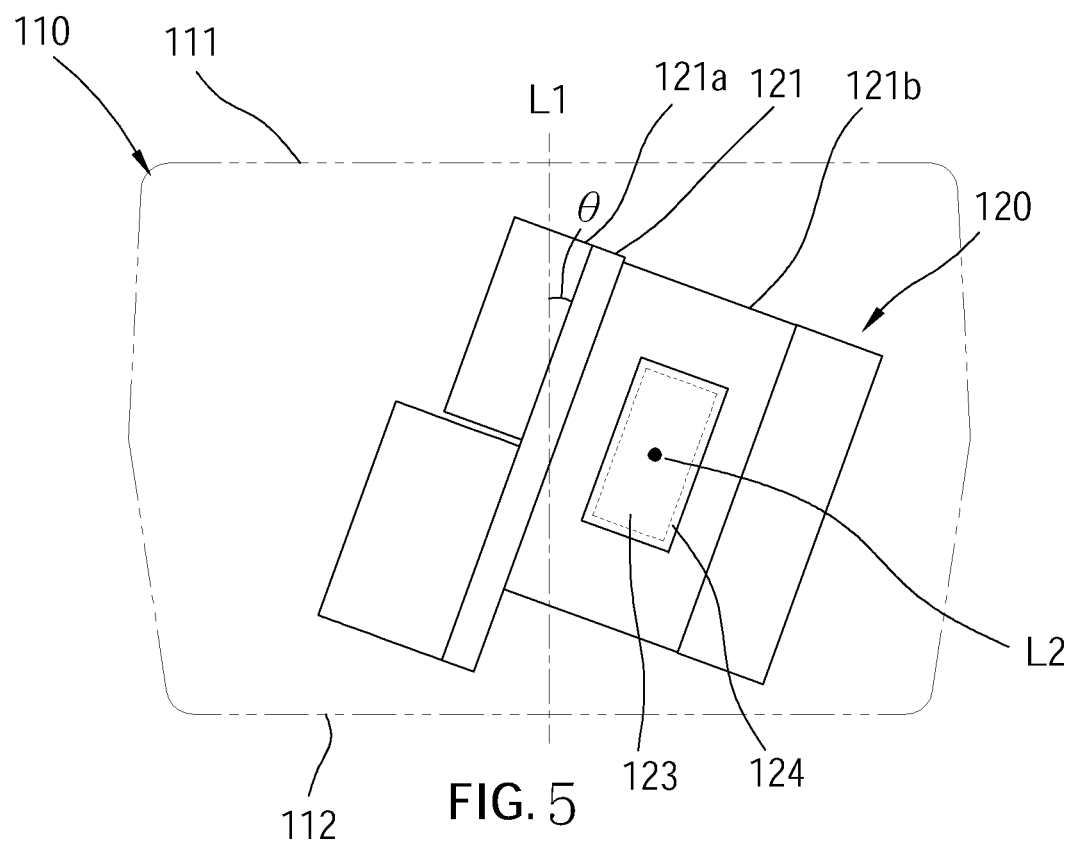
Figure 8:
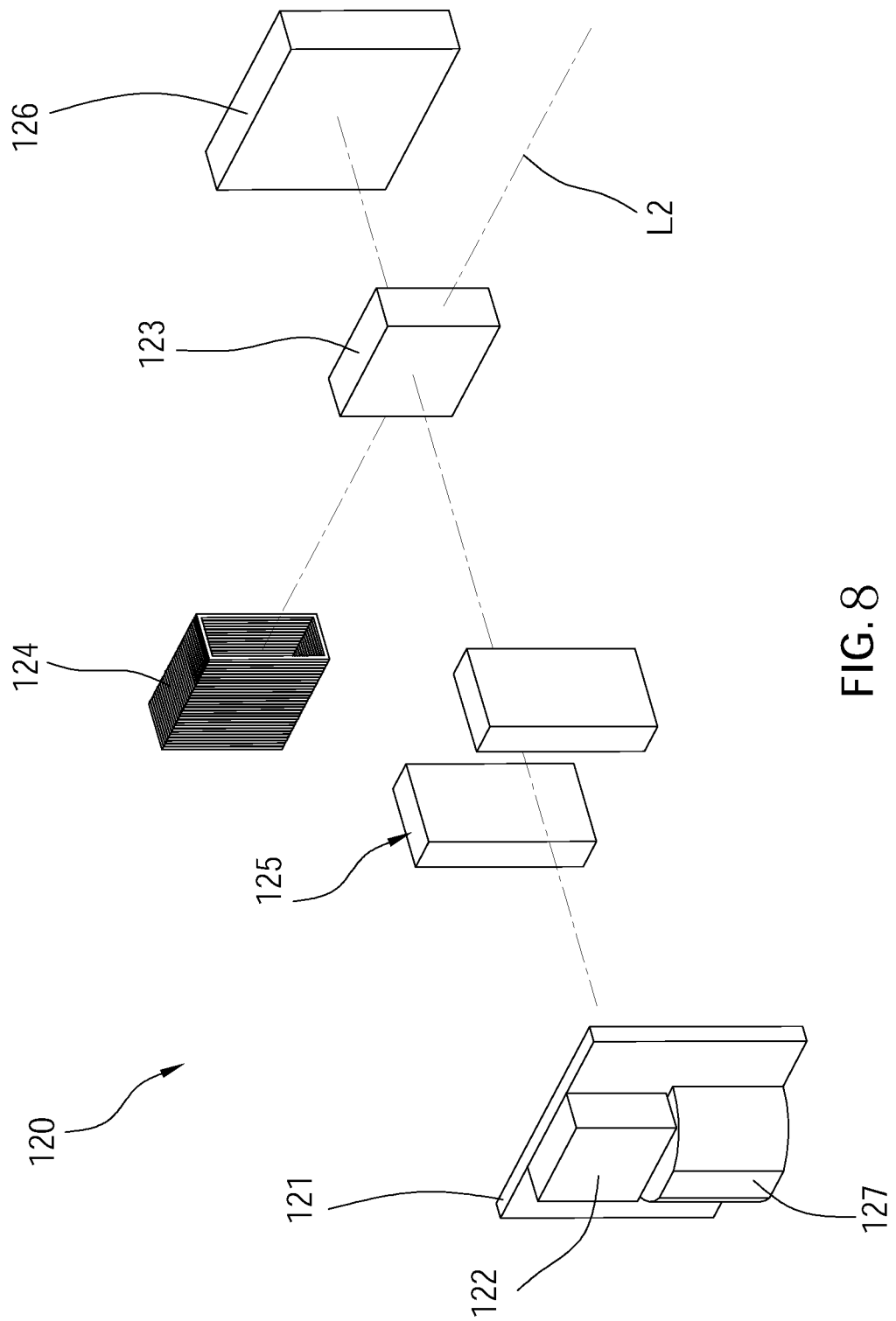
FIG. 8 is an exploded view showing the electronic assembly of the embodiment shown in FIG. 1.

As shown in FIG. 4 to FIG. 8, the electronic assembly 120 includes a circuit board 121, a near-field communication chip 122, and a coil set. The circuit board 121 has a first side 121a and a second side 121b which are opposite to each other. The near-field communication chip 122 is disposed on the first side 121a of the circuit board 121. The coil set is disposed on the second side 121b of the circuit board 121 and includes a magnetic core 123 and a coil 124. The coil 124 is wound around the magnetic core 123 and is connected to the near-field communication chip 122 in an electrical manner. In the present embodiment, the near-field communication chip 122 is electrically connected to the circuit board 121. The coil 124 is electrically connected to the circuit board 121 and is electrically connected to the near-field communication chip 122 through a circuit on the circuit board 121, in which the coil 124 is wound around the magnetic core 123 about a winding axis L2, and preferably the direction of the winding axis L2 is different from that of a normal line L1 passing through the first end 111 and the second end 112 of the housing 110. For example, an angle between the winding axis L2 and the normal line L1 ranges from 45 degrees to 90 degrees. In the present embodiment, the angle between the winding axis L2 and the normal line L1 is about 90 degrees (as shown in FIG. 5 and FIG. 8). Preferably, a number of turns of the coil 124 is 20 to 40. For example, in the present embodiment, the number of turns ranges from 28 to 33. The magnetic core 123 could be made of iron, cobalt, nickel, or an alloy thereof, but is not limited thereto. For instance, using manganese zinc ferrite or nickel zinc ferrite to produce the magnetic core 123, so that the magnetic core 123 has a high magnetic permeability to guide a magnetic field radiating thereon to transmit along the magnetic core 123. Therefore, the coil 124 wound around an outer peripheral of the core 123, produces an induced current, which is then transmitted to the near-field communication chip 122 to supply an electrical power for the operation of the near-field communication chip 122 and sending a corresponding wireless signal. With the design of the magnetic core 123 and the coil 124, the induction efficiency of the near-field communication data carrier 100 and the efficiency of data transmission could be improved. In other applications, the core 123 could also be made of other types of magnetically permeable materials.

Moreover, in the present embodiment, the near-field communication data carrier 100 also includes a frame disposed on the second side 121b of the circuit board 121, and the coil set is located between the frame and the circuit board 121. The frame includes two side plates 125 and a rear plate 126. The two side plates 125 are located at a front side and a rear side of the coil set, respectively, and are connected to the second side 121b of the circuit board 121. The rear plate 126 is located at a side of the coil set, so that the coil set is located between the circuit board 121 and the rear plate 126. The rear plate 126 is connected to the two side plates 125. Preferably, the two side plates 125 are mainly made of magnetically permeable materials and are located on the winding axis L2 of the coil 124 for improving the magnetically permeable effect of the core 123. In an embodiment, it is optional to provide single side plates 125 at one side of the core 123 and not necessary to have two side plates 125. However, in practice, it is preferred that the magnetically permeable side plate 125 is provided at both the front side and the rear side of the core 123. Furthermore, in an embodiment, the rear plate 126 could be made of insulating material, but is not limited thereto.

Figure 6:
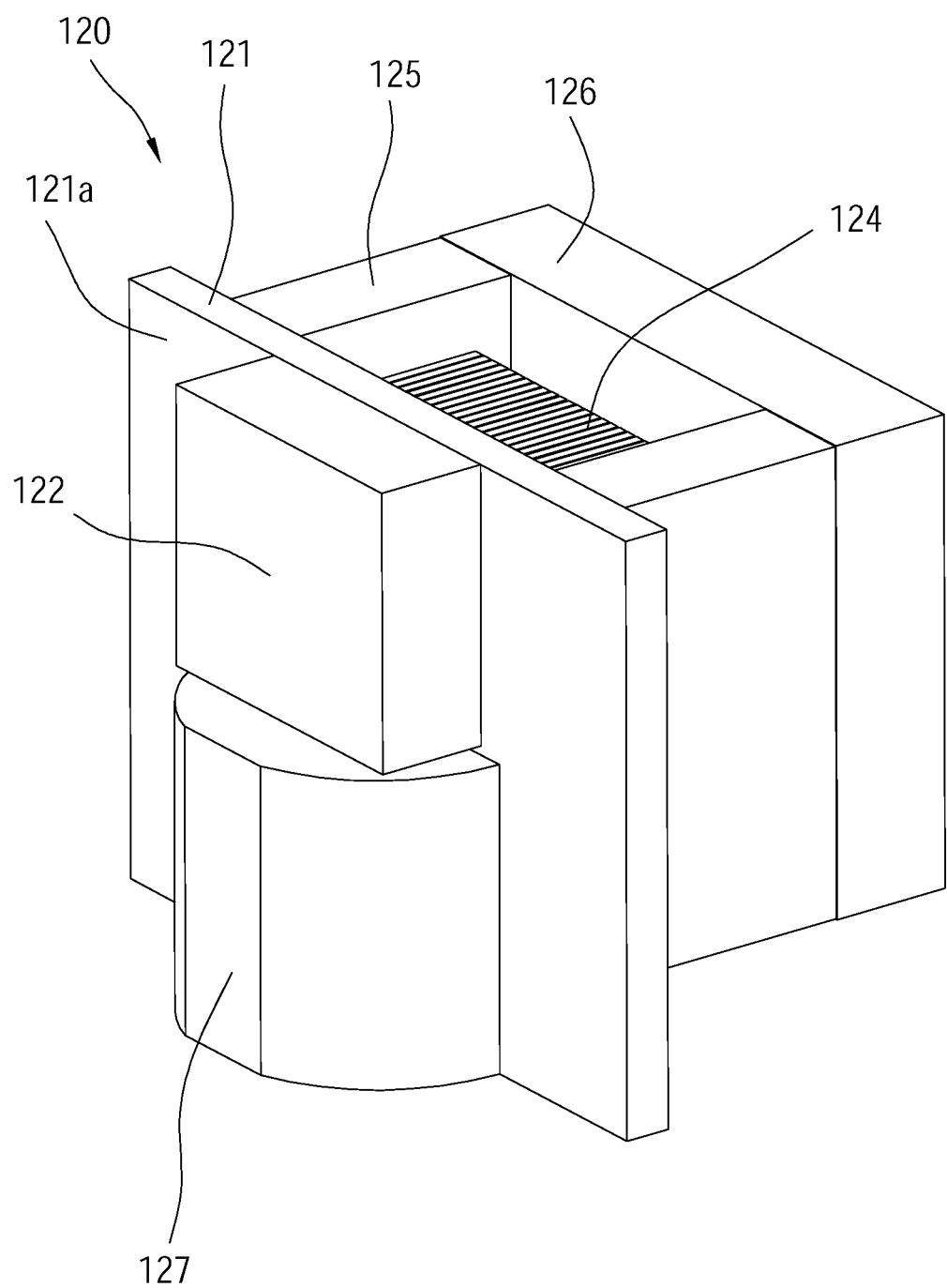
FIG. 6 is a perspective view showing the electronic assembly of the embodiment shown in FIG. 1.
Figure 7:
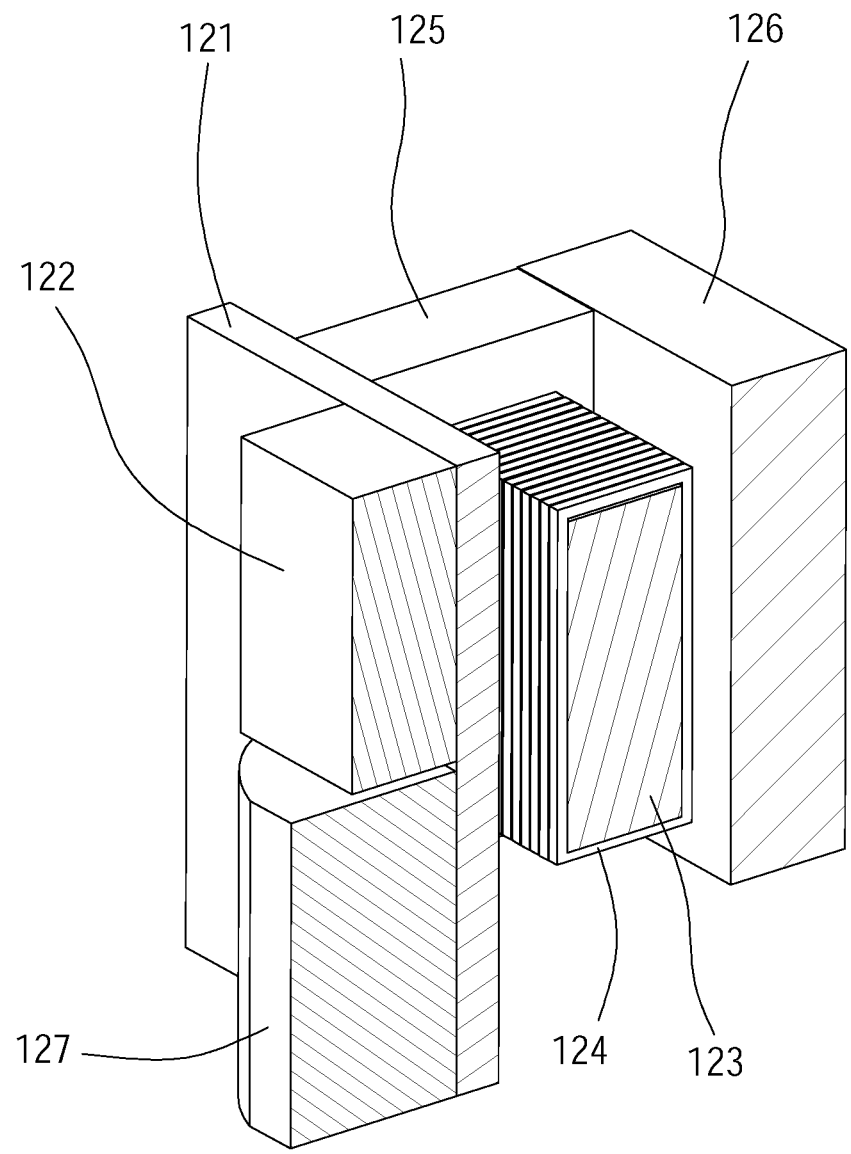
FIG. 7 is a partial perspective view of FIG. 6.

Referring to FIG. 4 and FIG. 6, in an embodiment, the electronic assembly 120 could be provided upright in the housing 110. Preferably, as also shown in FIG. 5, in the present embodiment, the electronic assembly 120 is provided in the housing 110 in a tilted manner, and the first side 121a of the circuit board 121, on which the near-field communication chip 122 is provided, is oriented toward the first end 111 of the housing 110. Preferably, an angle Θ between a surface of the first side 121a of the circuit board 121 and the normal line L1 is 15 degrees to 45 degree. In the present embodiment, the angle Θ is about 20 degrees to 30 degree. With the aforementioned design, when the near-field communication chip 122 is triggered or turned on, it would be beneficial for the near-field communication chip 122 to successfully send a wireless signal out from the metal object to improve the success rate and efficiency of wireless signal transmission to an external device (e.g. a smartphone, a laptop, etc.).

In an embodiment, the housing 110 and the electronic assembly 120 of the near-field communication data carrier 100 could be assembled in the following manner, but is not limited thereto: after the assembling of the components of the electronic assembly 120 is completed, the electronic assembly 120 is mounted on a support (not shown), wherein the electronic assembly 120 could be connected to the support through a solder 127 disposed on the circuit board 121, and then the electronic assembly 120 is encapsulated in the housing 110. For example, as the plastic may be injected to encapsulate the electronic assembly 120 by using a plastic injection molding process to produce the near-field communication data carrier 100.

Additionally, in order to allow the near-field communication data carrier 100 to possess sufficient magnetic induction strength or induction efficiency, preferably, in an embodiment, the near-field communication data carrier 100 should meet at least one of the following requirements: (1) the volume ratio of the electronic assembly 120 to the housing 110 is 10% to 35%; (2) the volume ratio of the coil set to the housing 110 ranges from 2% to 10%; (3) the volume ratio of the total volume of the coil set and the frame to the volume of the housing 110 is 6% to 20%. More preferably, the near-field communication data carrier 100 should meet at least one of the following requirements: (1) the volume ratio of the electronic assembly 120 to the housing 110 is 15% to 25%; (2) the volume ratio of the coil set to the housing 110 is 2% to 5%; (3) the volume ratio of the total volume of the coil set and the frame to the volume of the housing 110 is 10% to 15%.

For instance, in the present embodiment, the housing 110 is cylindrical in shape, and has a diameter of 6 mm and a height of 4 mm. The volume of the housing 110 is about 109.2 mm$^3$; the volume of the electronic assembly 120 is about 19.6 mm$^3$, the volume of the coil set is about 2.86 mm$^3$, the volume of the magnetic core 123 is about 2.33 mm$^3$, and the volume of the frame is about 9.38 mm$^3$. The volume ratio of the electronic assembly 120 to the housing 110 is about 18%; the volume ratio of the coil set to the housing 110 is about 2.6%; the total volume of the coil set and the frame is about 12.24 mm$^3$; and the volume ratio of the total volume of the coil set and the frame to the volume of the housing 110 is about 11.2%.

In addition to the application of the near-field communication data carrier 100 of the present invention to the metal object, such as the side pull ring described above, the near-field communication data carrier 100 could also be applied to other types of metal object. For example, FIG. 9 to FIG. 34 schematically show the application of the near-field communication data carrier 100 of the present invention to different metal objects.

Figure 9:
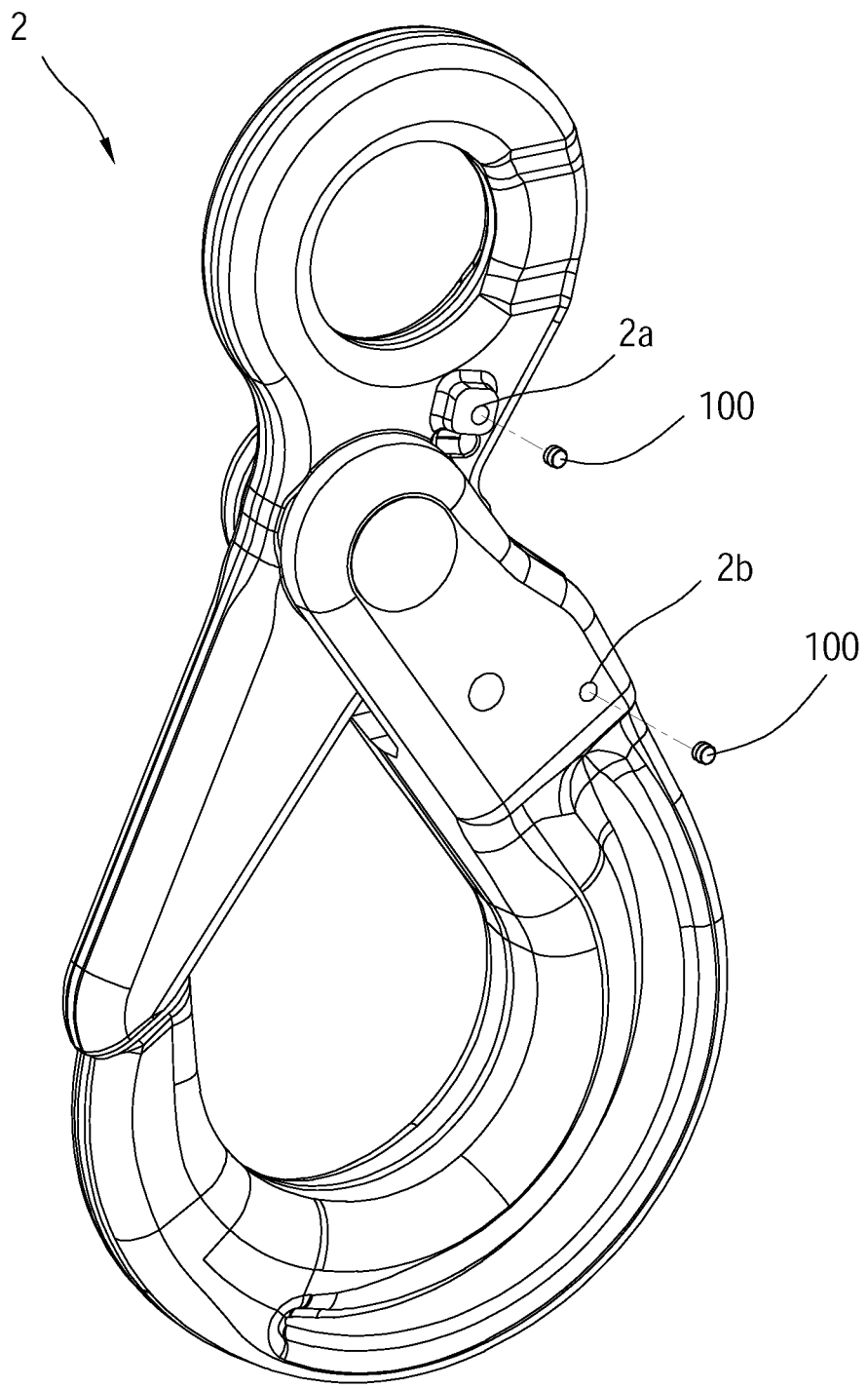
FIGS. 9 to 34 are perspective views showing the near-field communication data carriers applied to different metal objects.

As shown in FIG. 9, the metal object 2 is a snap hook as an example. The near-field communication data carrier 100 could be mounted in the receiving portion 2a or 2b of the snap hook.

Figure 10:
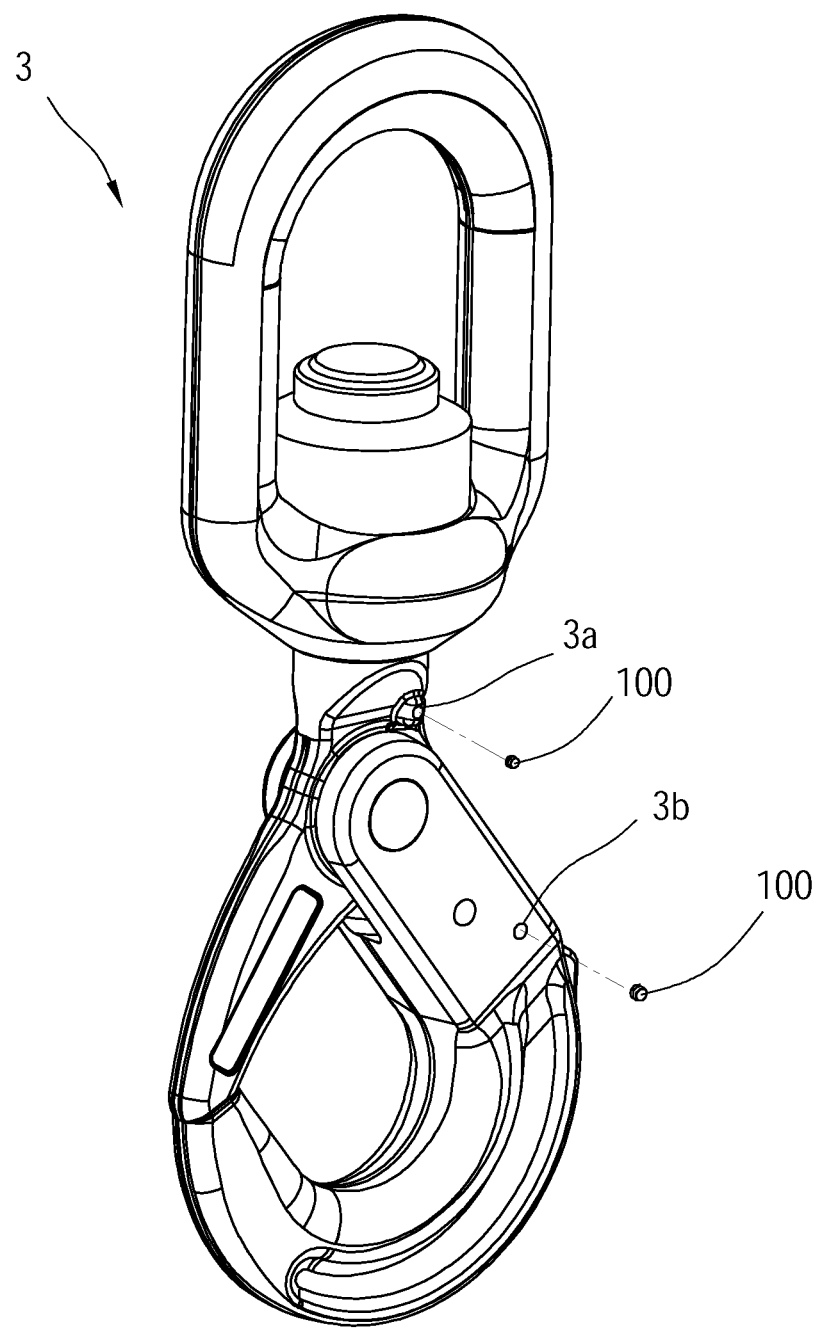

As shown in FIG. 10, the metal object 3 is a swivel snap hook as an example. The near-field communication data carrier 100 could be mounted in the receiving portion 3a or 3b of the swivel snap hook.

Figure 11:
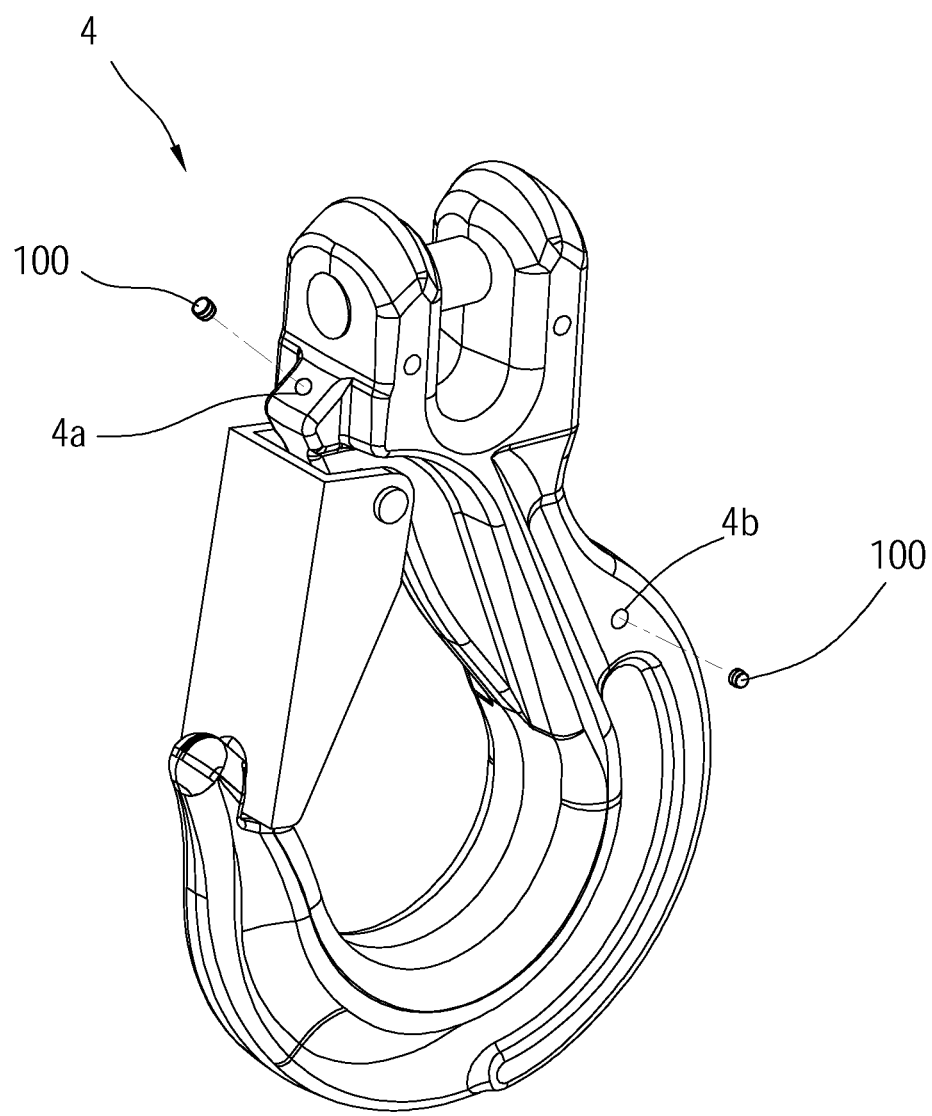

As shown in FIG. 11, the metal object 4 is another snap hook as an example. The near-field communication data carrier 100 could be mounted in the receiving portion 4a or 4b of the snap hook.

Figure 12:
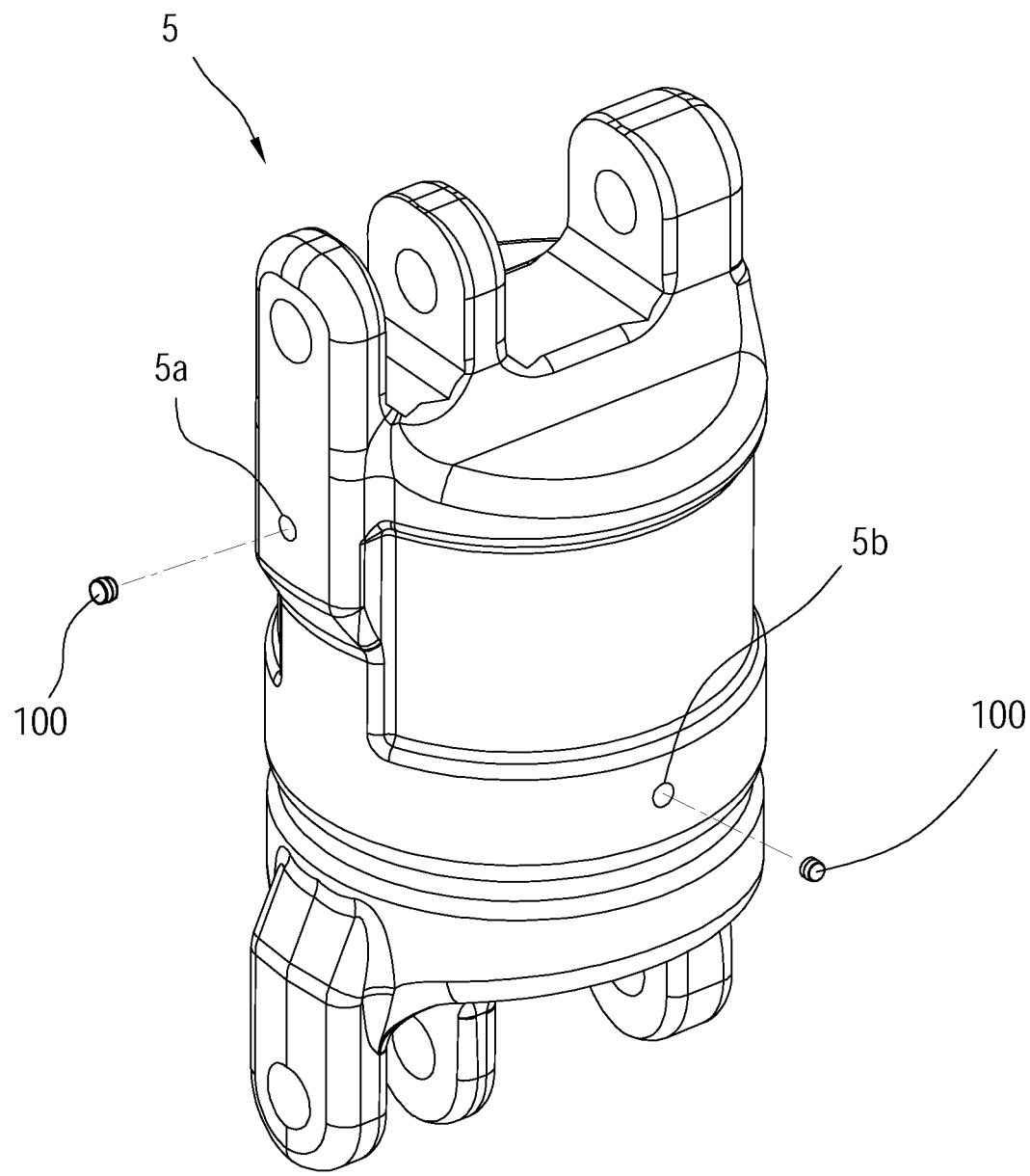

As shown in FIG. 12, the metal object 5 is a hoist as an example. The near-field communication data carrier 100 could be mounted in the receiving portion 5a or 5b of the hoist.

Figure 13:
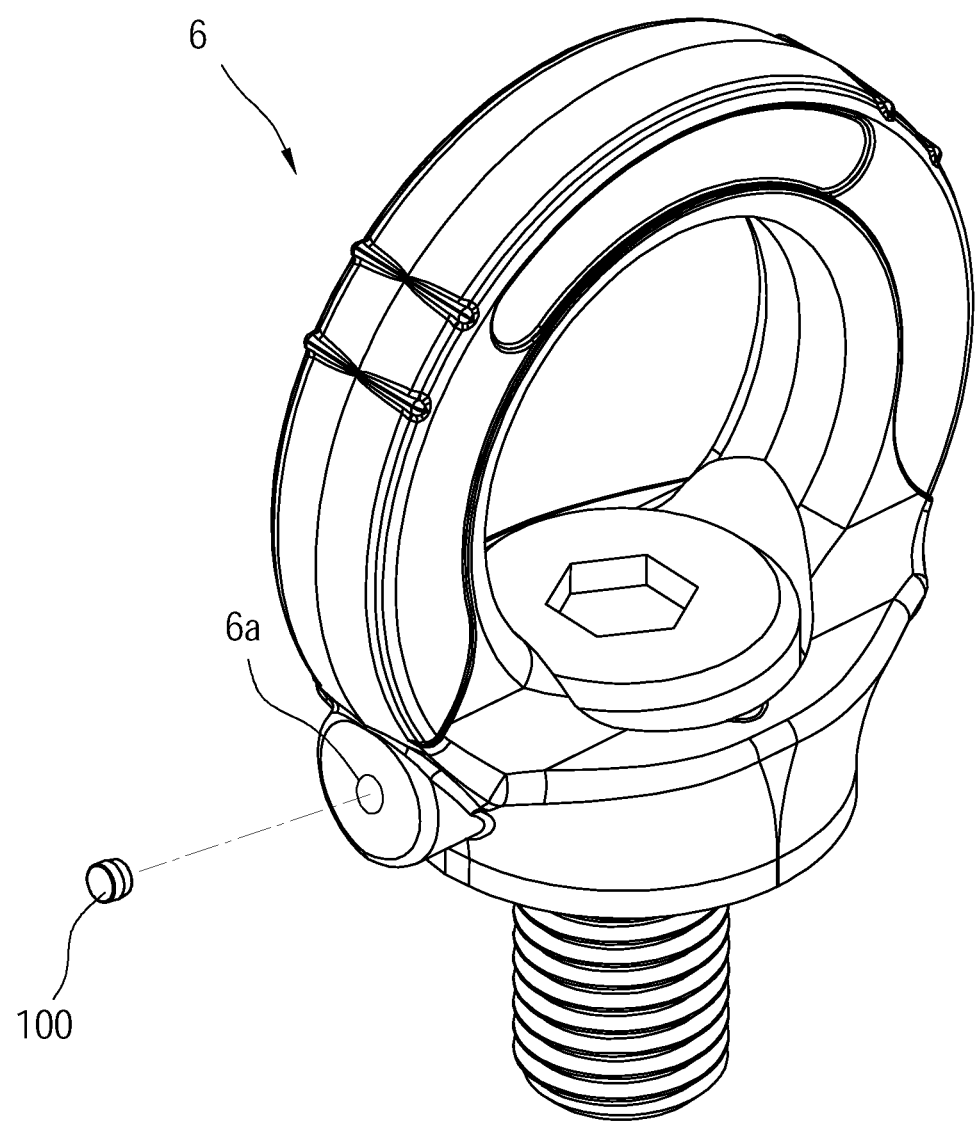

As shown in FIG. 13, the metal object 6 is an eye bolt as an example. The near-field communication data carrier 100 could be mounted in the receiving portion 6a of the eye bolt.

Figure 14:
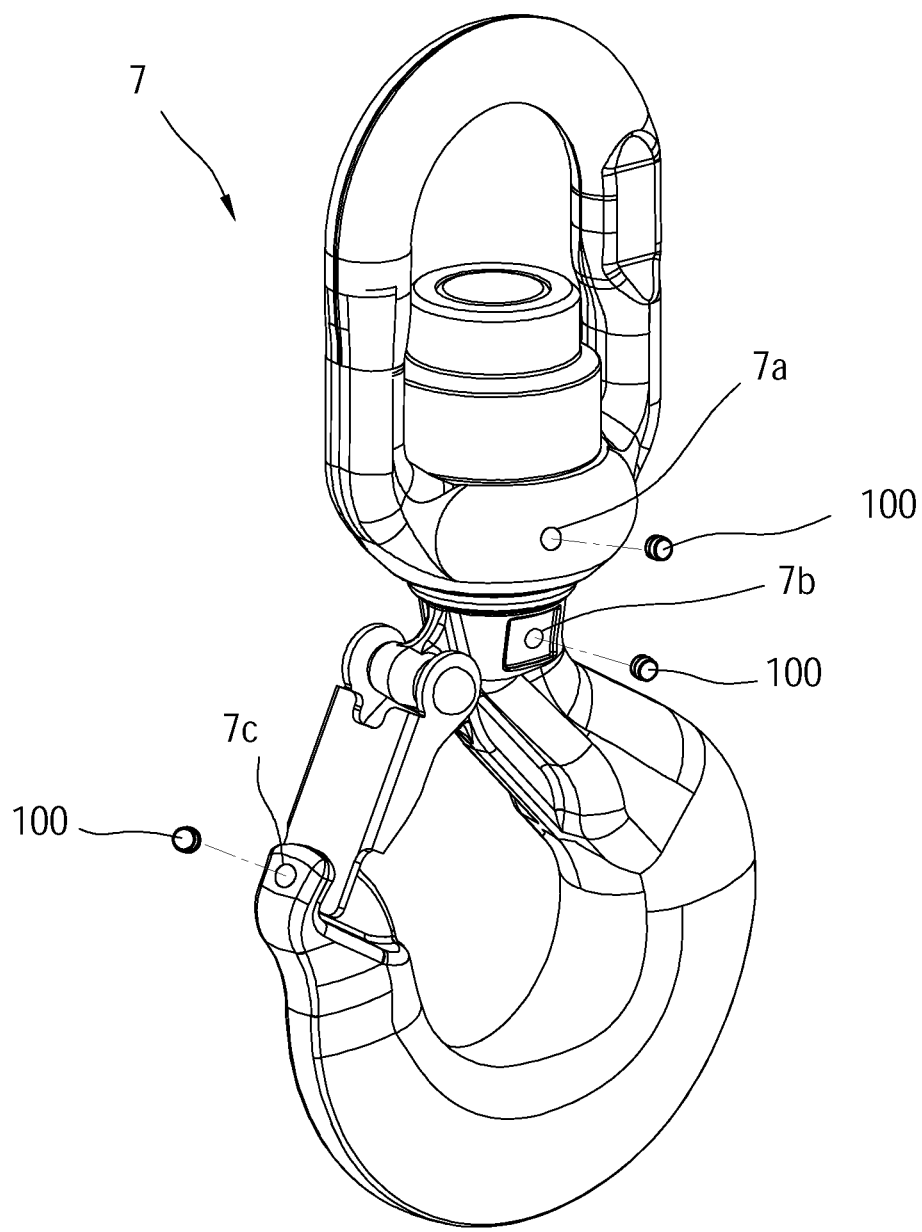

As shown in FIG. 14, the metal object 7 is another swivel snap hook as an example. The near-field communication data carrier 100 could be mounted in the receiving portion 7a, 7b or 7c of the swivel snap hook.

Figure 15:
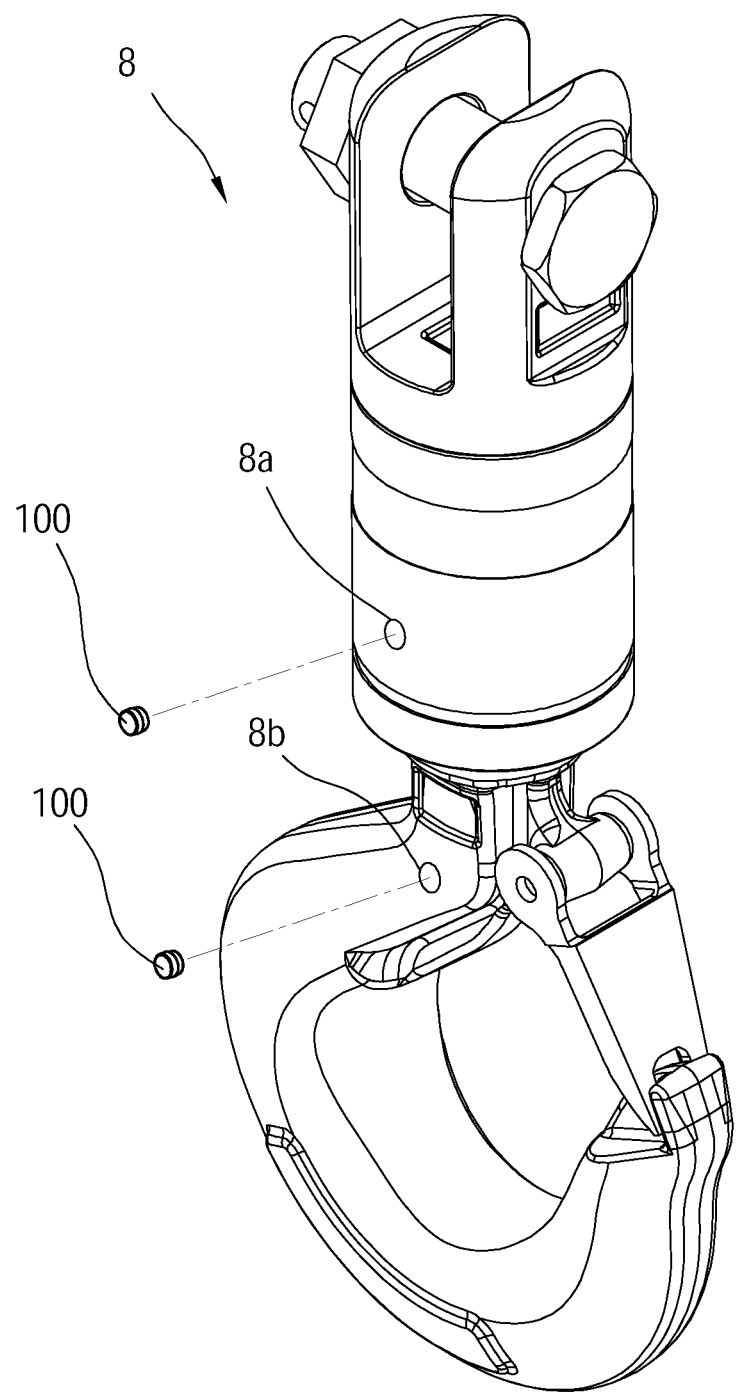

As shown in FIG. 15, the metal object 8 is still another snap hook as an example. The near-field communication data carrier 100 could be mounted in the receiving portion 8a or 8b of the snap hook.

Figure 16:
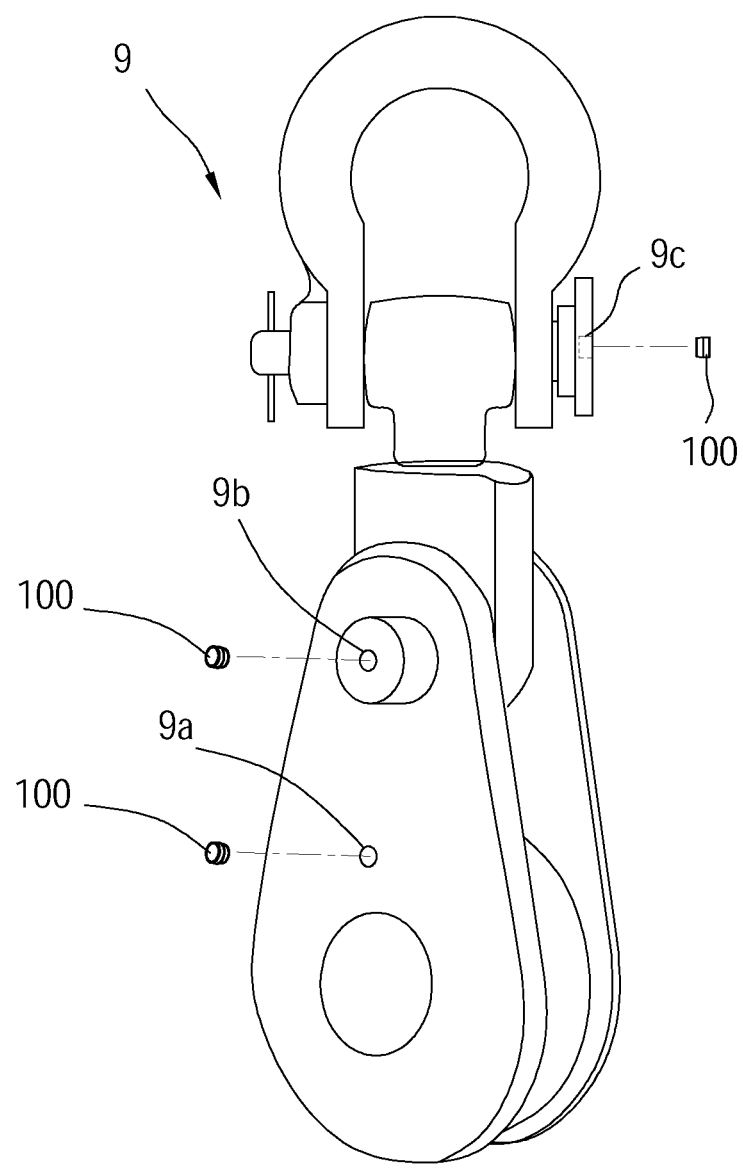

As shown in FIG. 16, the metal object 9 is a snatch block as an example. The near-field communication data carrier 100 could be mounted in the receiving portion 9a, 9b or 9c of the snatch block.

Figure 17:
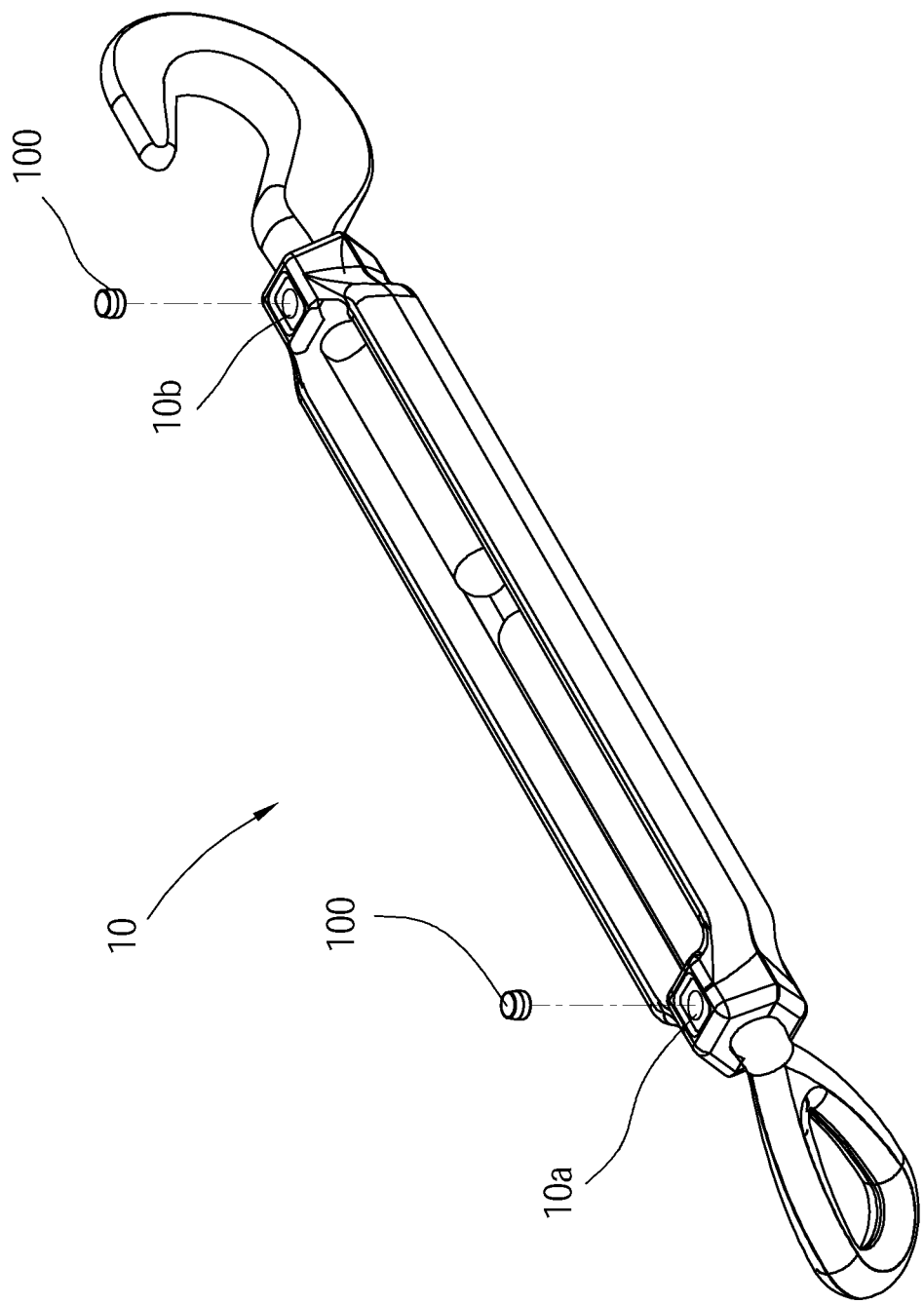

As shown in FIG. 17, the metal object 10 is another type of hook as an example. The near-field communication data carrier 100 could be mounted in the receiving portion 10a or 10b of the type of hook.

Figure 18:
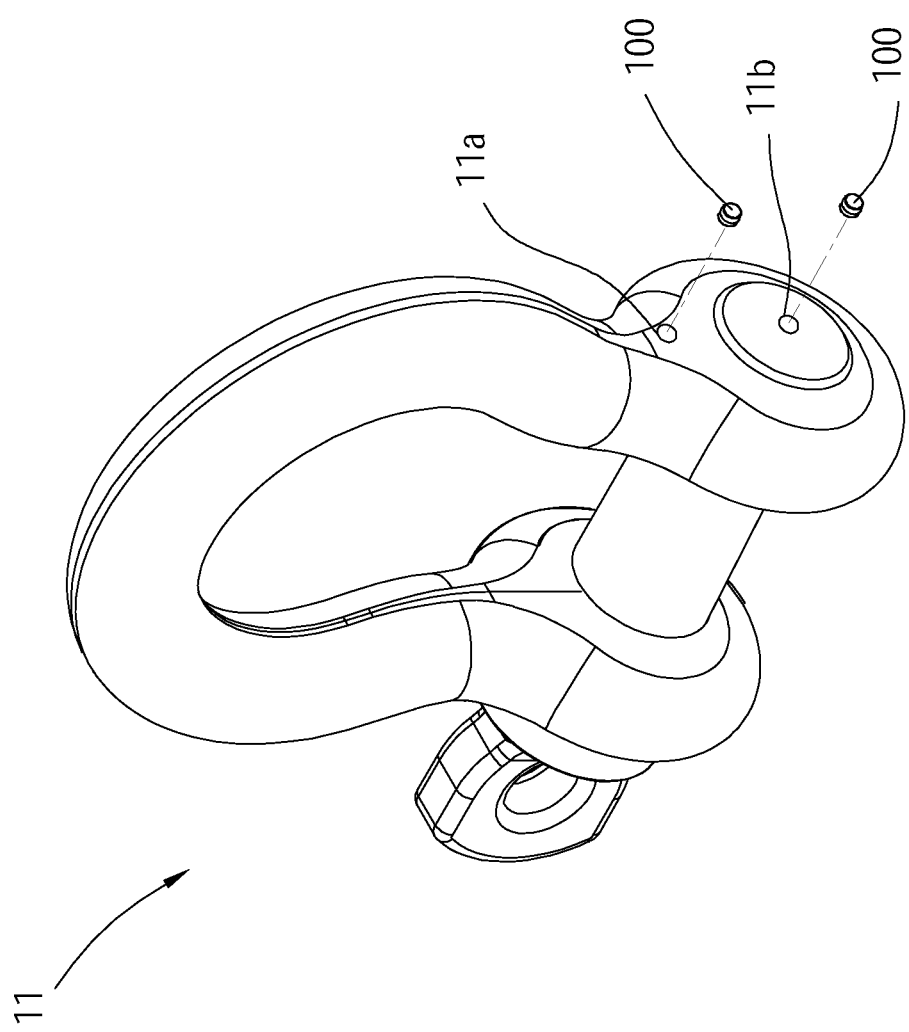

As shown in FIG. 18, the metal object 11 is a shackle as an example. The near-field communication data carrier 100 could be mounted in the receiving portion 11a or 11b of the shackle.

Figure 19:
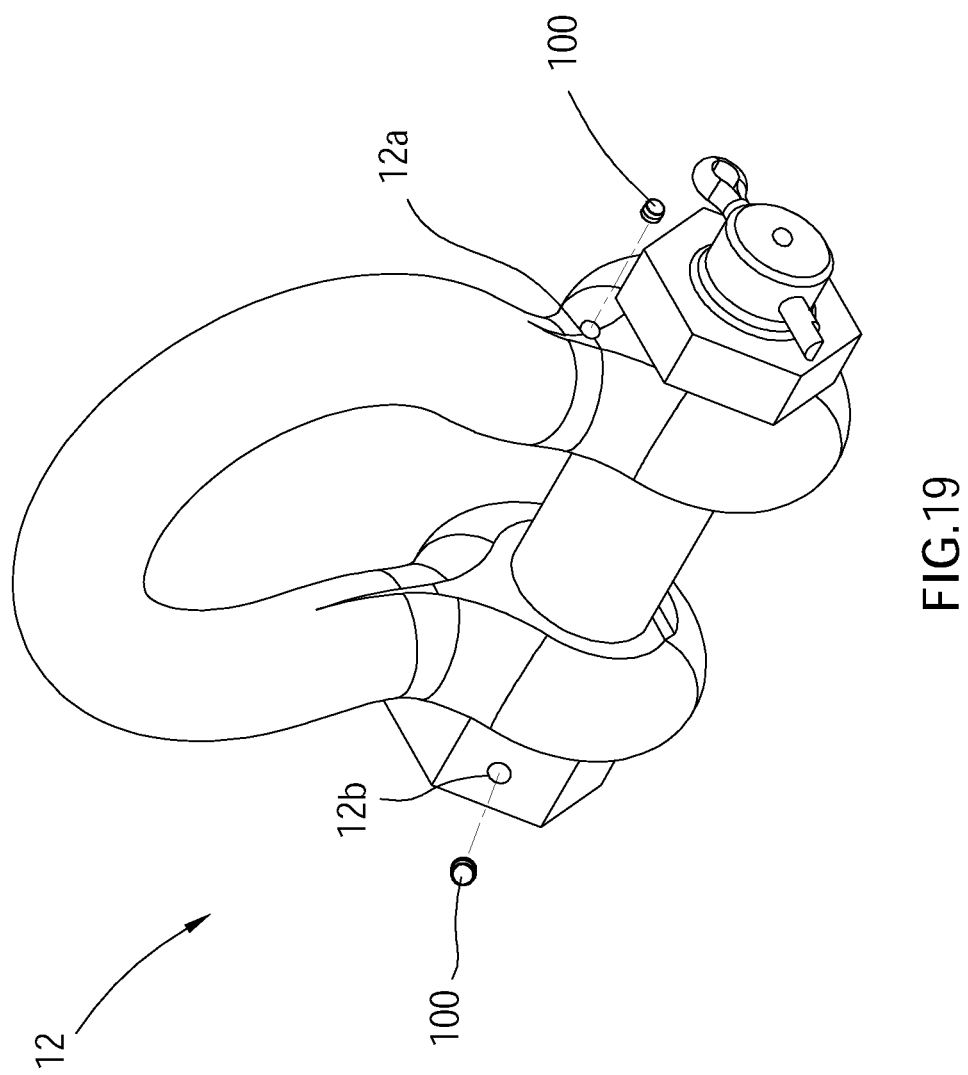

As shown in FIG. 19, the metal object 12 is another type of shackle as an example. The near-field communication data carrier 100 could be mounted in the receiving portion 12a or 12b of the type of shackle.

Figure 20:
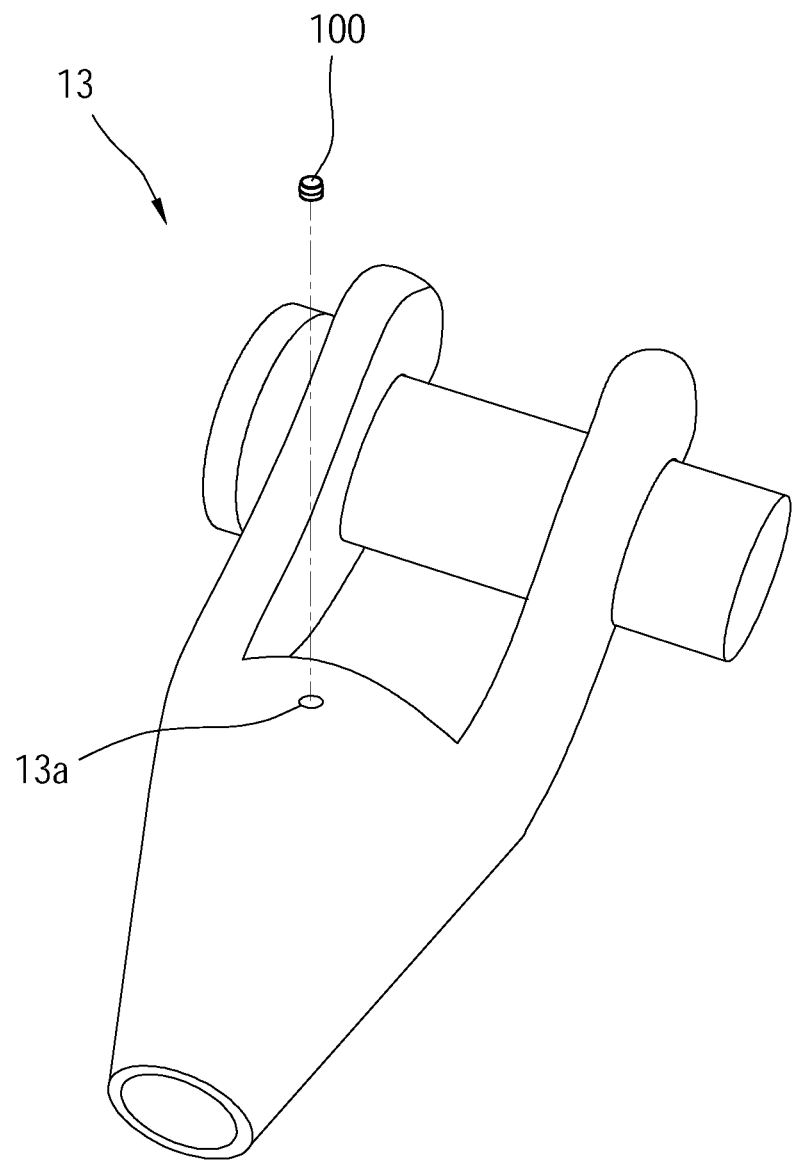

As shown in FIG. 20, the metal object 13 is a rope socket as an example. The near-field communication data carrier 100 could be mounted in the receiving portion 13a of the rope socket.

Figure 21:
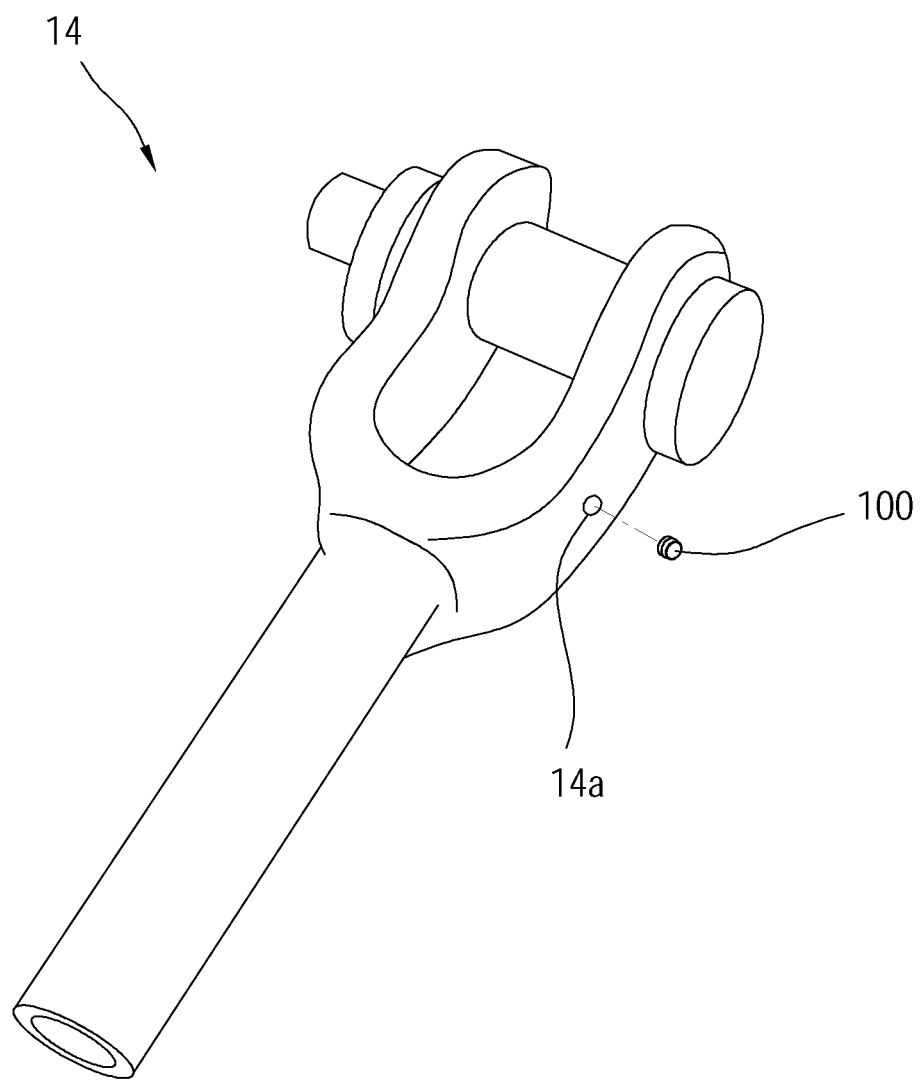

As shown in FIG. 21, the metal object 14 is another type of rope socket as an example. The near-field communication data carrier 100 could be mounted in the receiving portion 14a of the type of rope socket.

Figure 22:
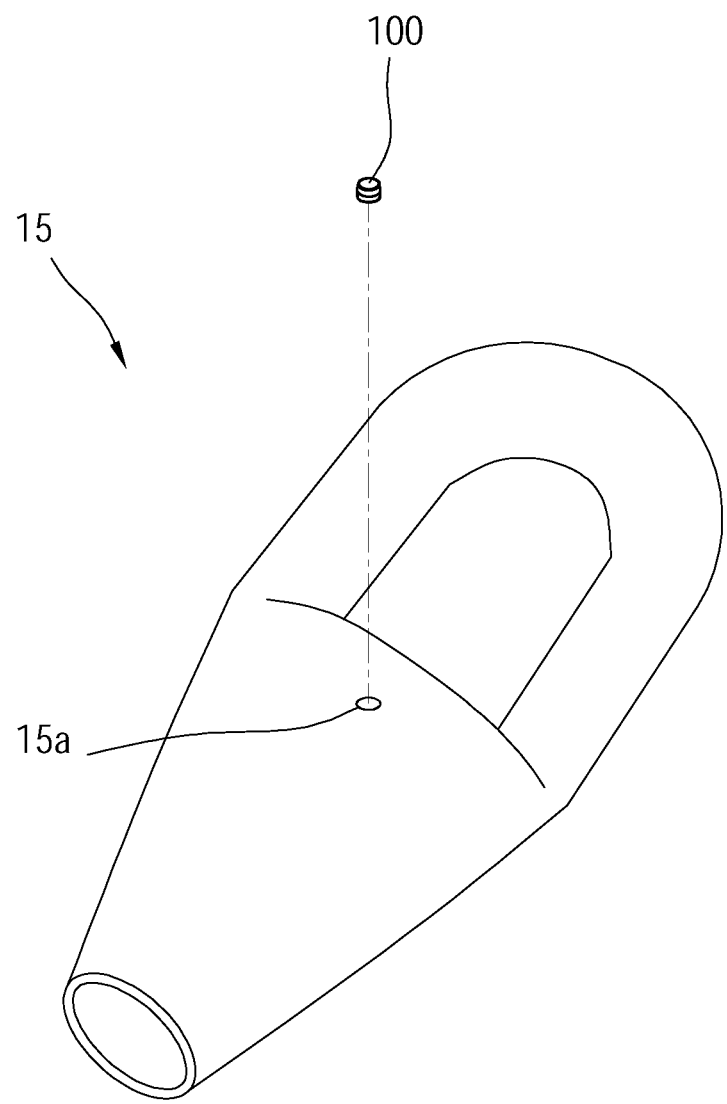

As shown in FIG. 22, the metal object 15 is still another type of rope socket as an example. The near-field communication data carrier 100 could be mounted in the receiving portion 15a of the type of rope socket.

Figure 23:
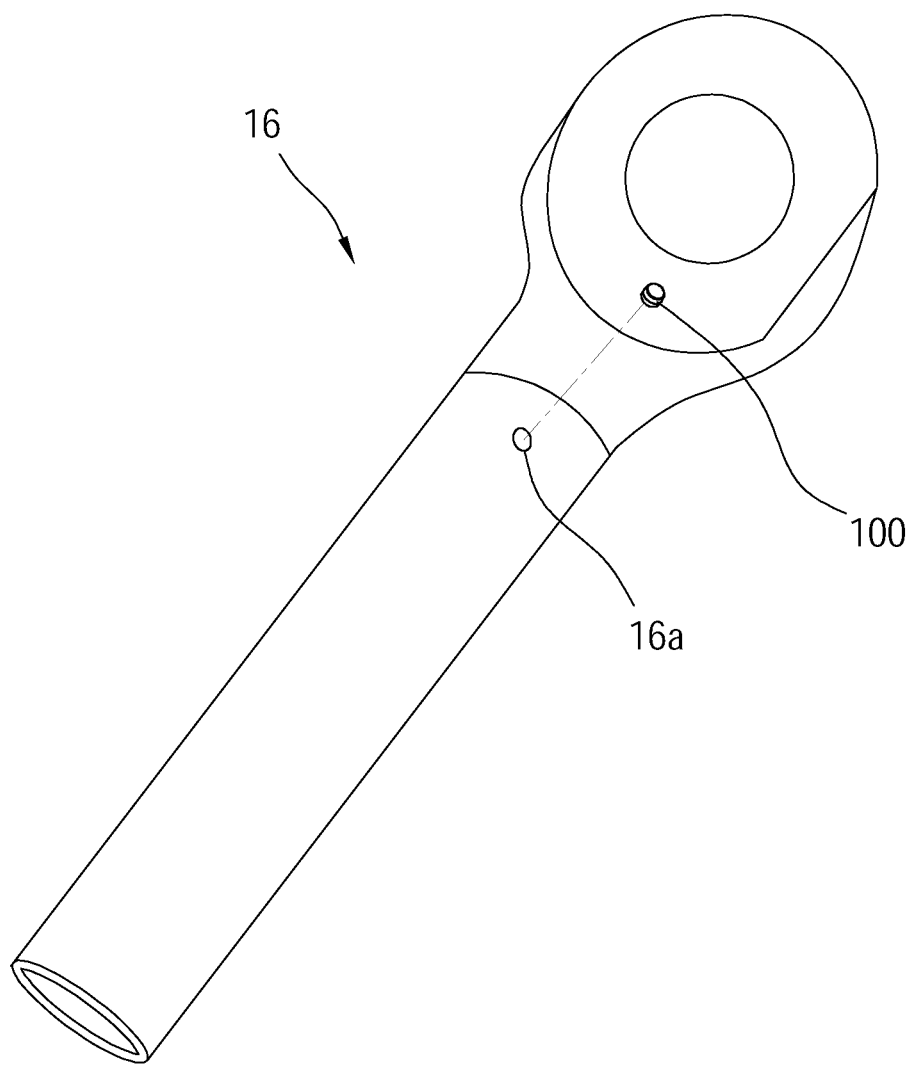

As shown in FIG. 23, the metal object 16 is still another type of rope socket as an example. The near-field communication data carrier 100 could be mounted in the receiving portion 16a of the type of rope socket.

Figure 24:
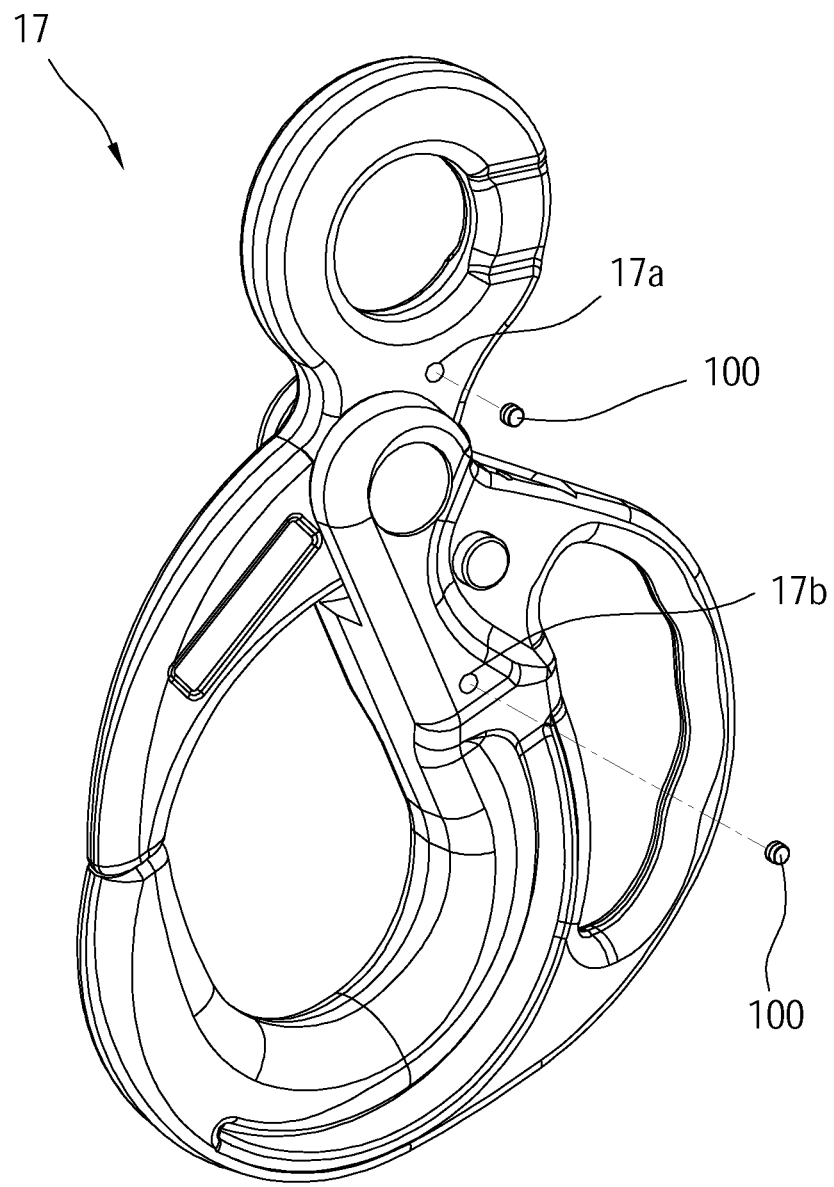

As shown in FIG. 24, the metal object 17 is still another snap hook as an example. The near-field communication data carrier 100 could be mounted in the receiving portion 17a or 17b of the snap hook.

Figure 25:
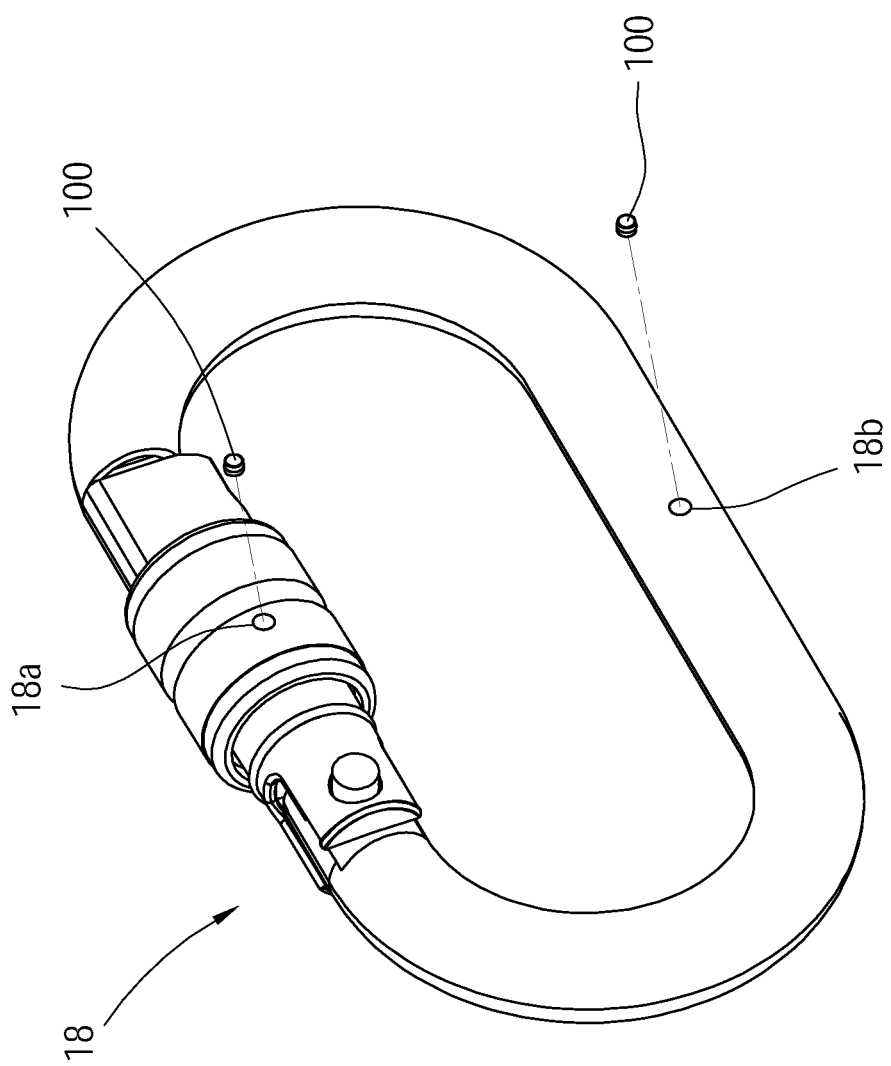

As shown in FIG. 25, the metal object 18 is a carabiner hook ring as an example. The near-field communication data carrier 100 could be mounted in the receiving portion 18a or 18b of the carabiner hook ring.

Figure 26:
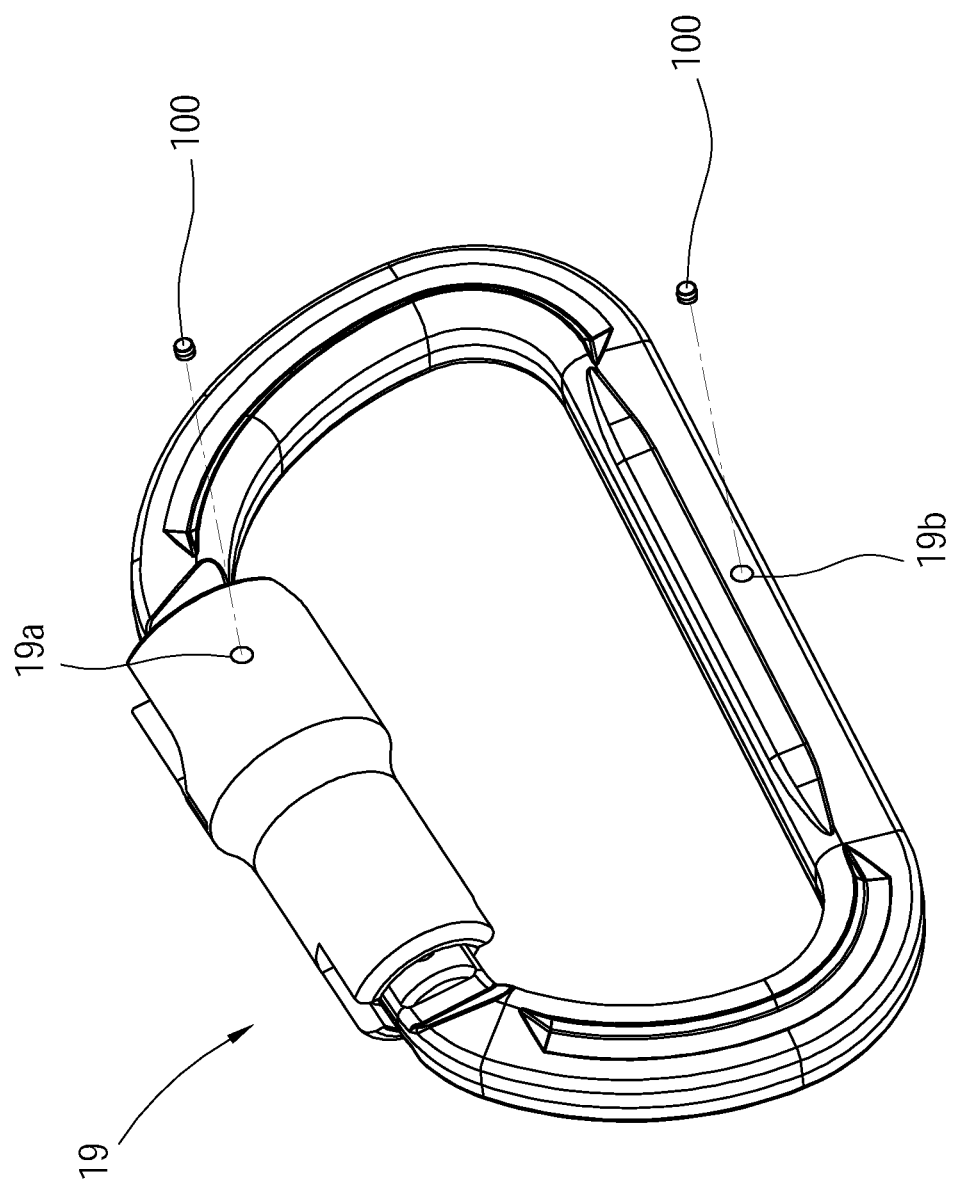

As shown in FIG. 26, the metal object 19 is another type of carabiner hook ring as an example. The near-field communication data carrier 100 could be mounted in the receiving portion 19a or 19b of the carabiner hook ring.

Figure 27:
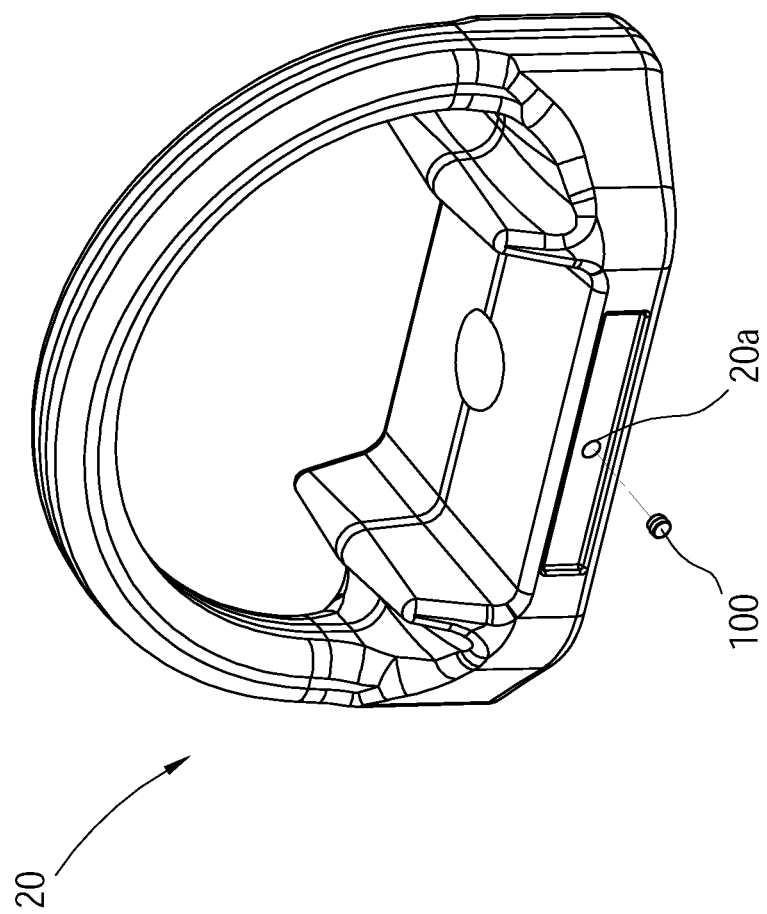

As shown in FIG. 27, the metal object 20 is hoist ring as an example. The near-field communication data carrier 100 could be mounted in the receiving portion 20a of the hoist ring.

Figure 28:
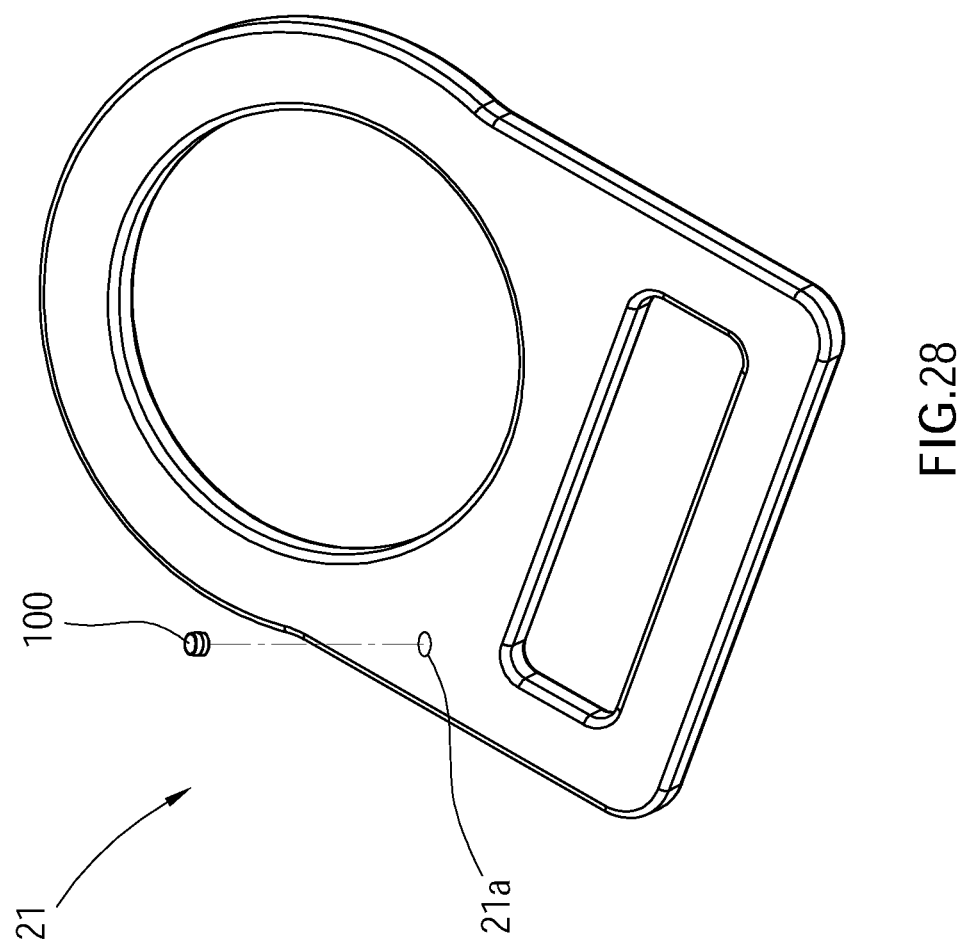

As shown in FIG. 28, the metal object 21 is a buckle as an example. The near-field communication data carrier 100 could be mounted in the receiving portion 21a of the buckle.

Figure 29:
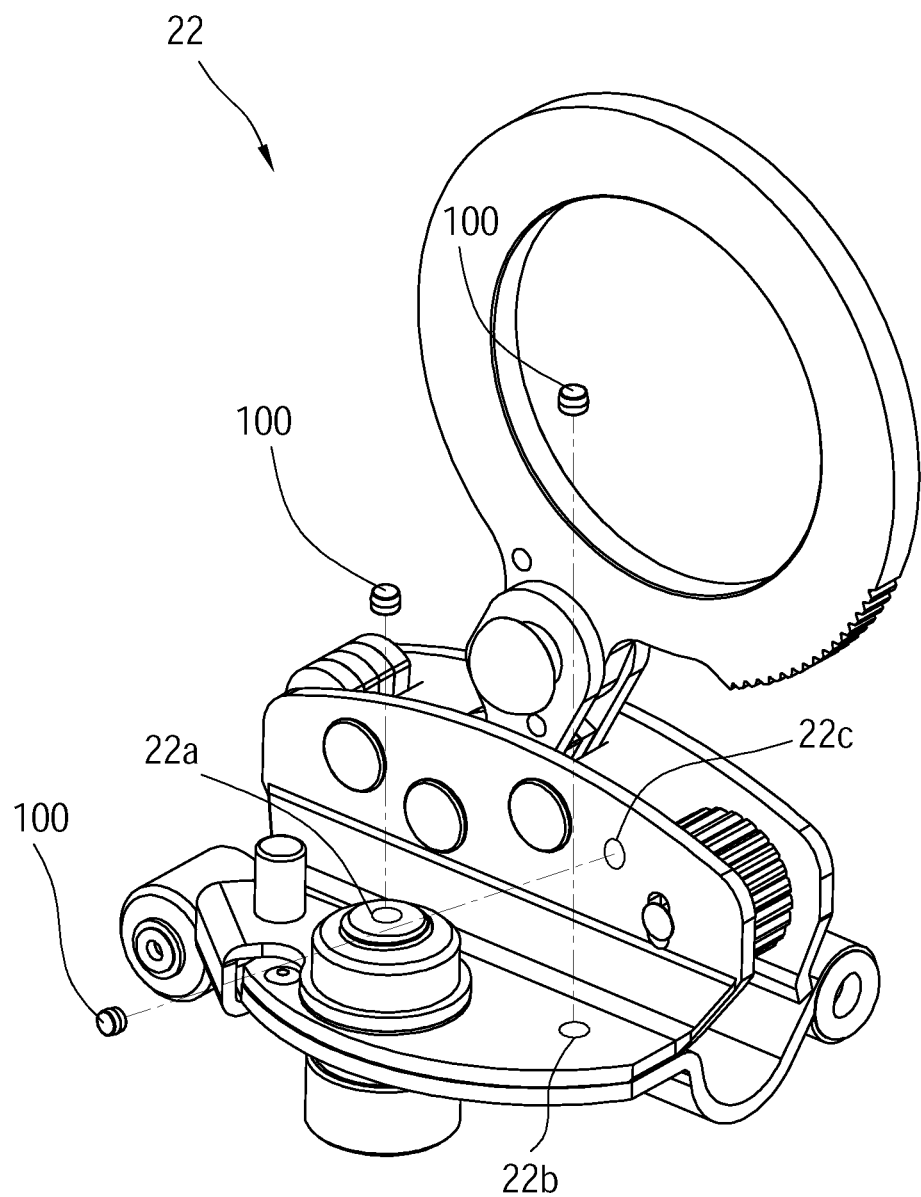

As shown in FIG. 29, the metal object 22 is a rope grab as an example. The near-field communication data carrier 100 could be mounted in the receiving portion 22a, 22b or 22c of the rope grab.

Figure 30:
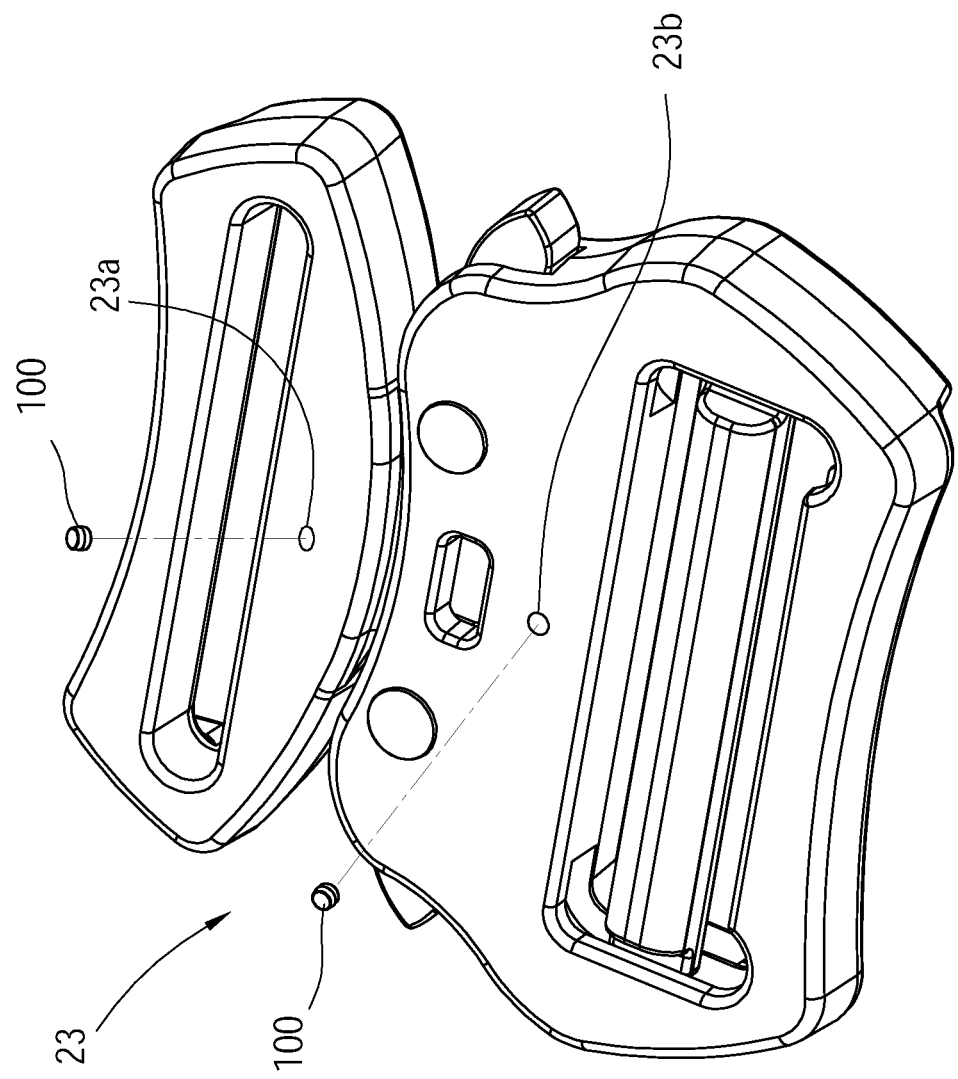

As shown in FIG. 30, the metal object 23 is a squeeze buckle as an example. The near-field communication data carrier 100 could be mounted in the receiving portion 23a or 23b of the squeeze buckle.

Figure 31:
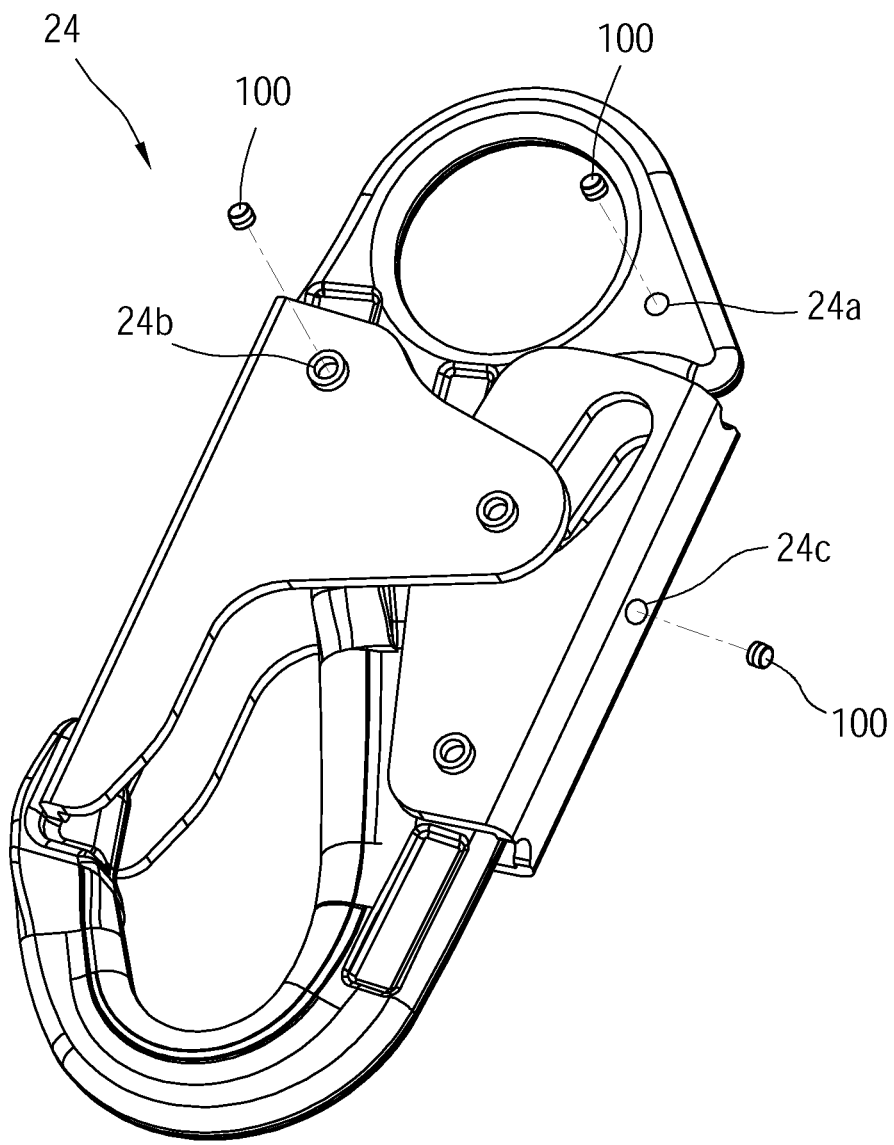

As shown in FIG. 31, the metal object 24 is still another type of snap hook as an example. The near-field communication data carrier 100 could be mounted in the receiving portion 24a, 24b or 24c of the snap hook.

Figure 32:
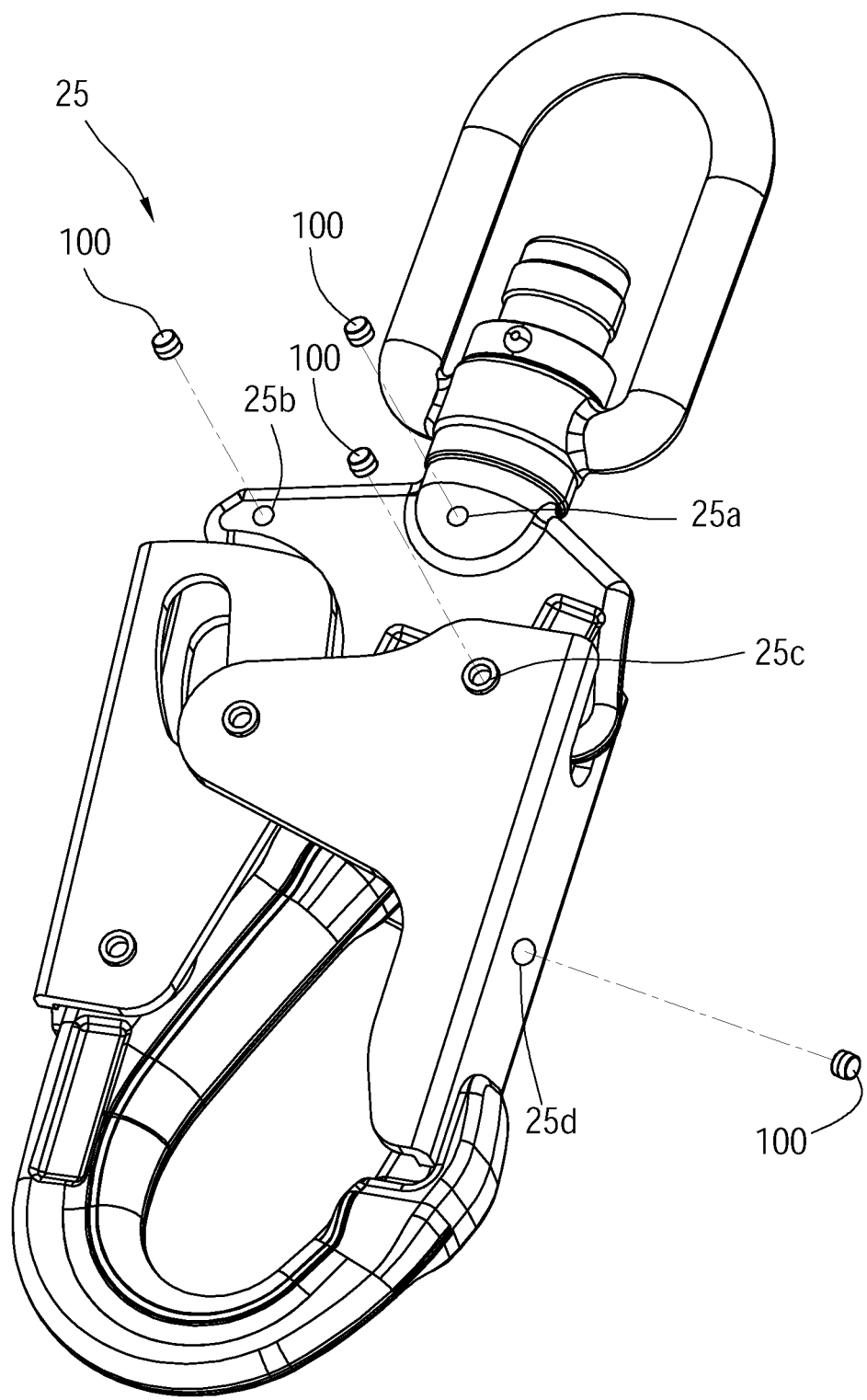

As shown in FIG. 32, the metal object 25 is still another type of snap hook as an example. The near-field communication data carrier 100 could be mounted in the receiving portion 25a, 25b, 25c or 25d of the snap hook.

Figure 33:
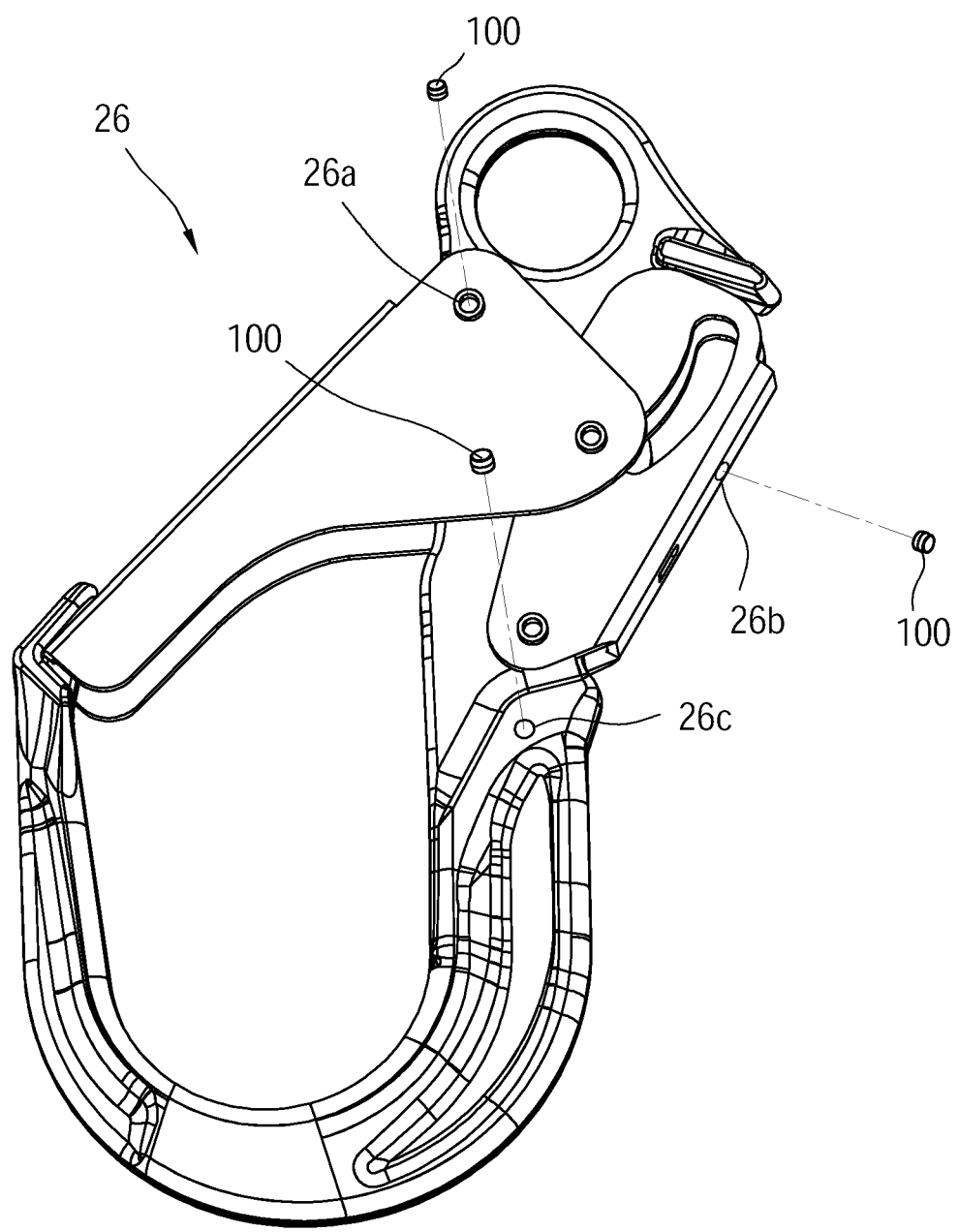

As shown in FIG. 33, the metal object 26 is still another type of snap hook as an example. The near-field communication data carrier 100 could be mounted in the receiving portion 26a, 26b or 26c of the snap hook.

Figure 34:
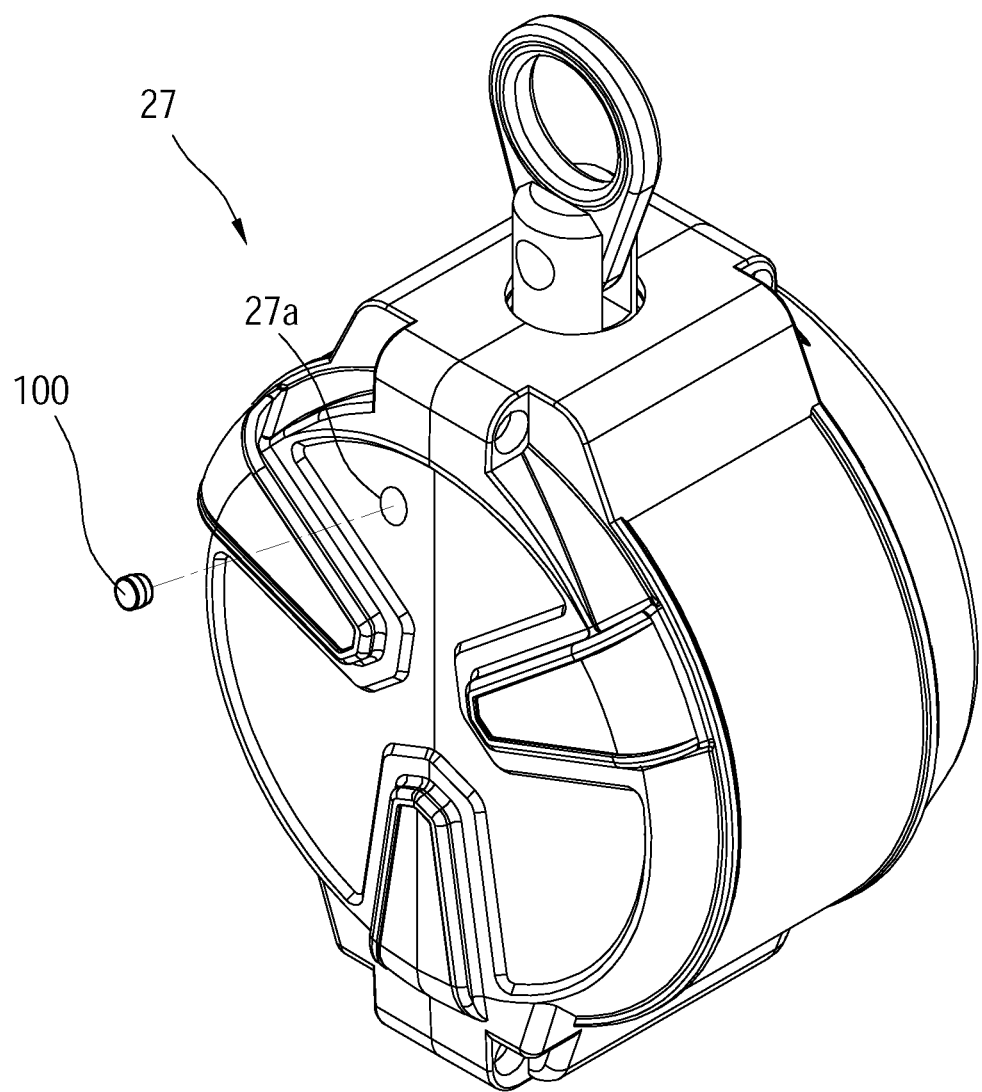

As shown in FIG. 34, the metal object 27 is a fall arrester as an example. The near-field communication data carrier 100 could be mounted in the receiving portion 27a of the fall arrester.

The selection of the location of the receiving portion as described above is mainly based on the less influence on the structural strength of the metal object. However, in other embodiments, the location of the receiving portion is not limited to the examples given above. In other applications, the receiving portion could be disposed at other locations in the metal object.

Besides adapted in the metal object describing above, the near-field communication data carrier could also be adapted in any kinds of connecting ring, shackle, pull ring, rope socket, snatch block, hoist ring, swivel, swivel hoist ring, eye bolt, bearing swivels, hook, buckle, carabiner, double hook belt, chain, ratchet, rope brake, fall arrester, snap hook, hoist or another type of metal object not mentioned above. In addition to another application, the housing 110 could be also adapted with another size or shape and is not limited to the examples given above that the size of the housing 110 is 6 mm (diameter) times 4 mm (height), and the housing 110 is cylindrical in shape. For example, the housing 110 could be produced in other size, such as 4 mm times 4 mm, 5 mm times 5 mm, or 10 mm times 10 mm, etc. and could be produced in other shape, such as a prism, or pyramid, etc. Moreover, in an embodiment, the maximum diameter of the housing 110 could be designed as 1 mm to 10 mm, or 2 mm to 10 mm, or 3 mm to 10 mm; the maximum height of the housing 110 could be designed as 1 mm to 10 mm, 2 mm to 10 mm, or 3 mm to 10 mm.

With the aforementioned design, when the user would like to know about an information of a metal object he uses, he could scan the near-field communication data carrier 100 installed on the metal object through an electronic device such as a smartphone, and a laptop, etc. to get the information about the metal object, such as model number, size, mechanical properties, manufacturer, date of manufacture, working load limit, service life, and maintenance history, etc.

It must be pointed out that the embodiments described above are only some embodiments of the present invention. All equivalent structures and material which employ the concepts disclosed in this specification and the appended claims should fall within the scope of the present invention

What is claimed is:

1. A near-field communication data carrier adapted to be mounted in a metal object, comprising:
    a housing adapted to be mounted in the receiving portion, wherein the maximum diameter of the housing is not more than 10 mm, while the maximum height of the housing is not more than 10 mm; and
    an electronic assembly provided in the housing and including a circuit board, a near-field communication chip, and a coil set, wherein the circuit board has a first side and a second side opposite to the first side; the near-field communication chip is provided on the first side of the circuit board; and the coil set is provided on the second side of the circuit board and includes a magnetic core and a coil, which is wound around the magnetic core and is electrically connected to the near-field communication chip;
    wherein the housing has a first end and a second end opposite to the first end and is received in the receiving portion by a direction that the second end is oriented to the receiving portion; the electronic assembly is provided in the housing in a tilted manner; and the first side of the circuit board is oriented to the first end.

2. The near-field communication data carrier as claimed in claim 1, wherein the housing has a normal line passing through the first end and the second end; and an angle between a surface of the first side of the circuit board and the normal line is 15 degree to 45 degree.

3. The near-field communication data carrier as claimed in claim 1, wherein a volume ratio of the electronic assembly to the housing is 10% to 35%.

4. The near-field communication data carrier as claimed in claim 1, wherein a volume ratio of the coil set to the housing is 2% to 10%.

5. The near-field communication data carrier as claimed in claim 1, further including a frame provided on the second side of the circuit board, wherein the coil set is located between the circuit board and the frame.

6. The near-field communication data carrier as claimed in claim 5, wherein a volume ratio of a total volume of the coil set and the frame to a volume of the housing is 6% to 20%.

7. The near-field communication data carrier as claimed in claim 5, wherein the frame includes at least one side plate, which is made of magnetically permeable material, provided at a side of the magnetic core, and located on a winding axis of the coil.

8. The near-field communication data carrier as claimed in claim 1, wherein the housing has a first end and a second end opposite to the first end and is received in the receiving portion by a direction that the second end is oriented to the receiving portion; the housing has a normal line passing through the first end and the second end; and the direction of a winding axis of the coil is different from that of the normal line.

9. The near-field communication data carrier as claimed in claim 1, wherein an angle between a winding axis of the coil and the normal line is 45 degree to 90 degree.

10. The near-field communication data carrier as claimed in claim 1, wherein a number of turns of the coil is 20 to 40.

11. The near-field communication data carrier as claimed in claim 1, wherein the housing is mainly made of plastic material and magnetic conducted material.

12. A near-field communication data carrier adapted to be mounted in a metal object, comprising:
    a housing adapted to be mounted in the receiving portion, wherein the maximum diameter of the housing is not more than 10 mm, while the maximum height of the housing is not more than 10 mm; and
    an electronic assembly is encapsulated in the housing and including a circuit board, a near-field communication chip, and a coil set, wherein the circuit board has a first side and a second side opposite to the first side; the near-field communication chip is provided on the first side of the circuit board; and the coil set is provided on the second side of the circuit board and includes a magnetic core and a coil, which is wound around the magnetic core and is electrically connected to the near-field communication chip;
    wherein a plastic is injected to encapsulate the electronic assembly by using a plastic injection molding process.

13. A near-field communication data carrier adapted to be mounted in a metal object, comprising:
    a housing adapted to be mounted in the receiving portion, wherein the maximum diameter of the housing is not more than 10 mm, while the maximum height of the housing is not more than 10 mm;
    an electronic assembly provided in the housing and including a circuit board, a near-field communication chip, and a coil set, wherein the circuit board has a first side and a second side opposite to the first side; the near-field communication chip is provided on the first side of the circuit board; and the coil set is provided on the second side of the circuit board and includes a magnetic core and a coil, which is wound around the magnetic core and is electrically connected to the near-field communication chip; and
    wherein the housing has a first end and a second end opposite to the first end and is received in the receiving portion by a direction that the second end is oriented to the receiving portion; the housing has a normal line passing through the first end and the second end; and the direction of a winding axis of the coil is different from that of the normal line.

\* \* \* \* \*